(12) United States Patent
Do et al.

(10) Patent No.: US 12,300,668 B2
(45) Date of Patent: May 13, 2025

(54) SEMICONDUCTOR PACKAGE

(71) Applicant: Samsung Electronics Co., Ltd., Suwon-si (KR)

(72) Inventors: Raehyung Do, Asan-si (KR); Seunghyun Go, Asan-si (KR); Jungsik Lee, Seoul (KR); Jongho Lee, Hwaseong-si (KR); Younghun Cheong, Seoul (KR); Cheolsoo Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 455 days.

(21) Appl. No.: 17/889,053

(22) Filed: Aug. 16, 2022

(65) Prior Publication Data

US 2023/0178518 A1 Jun. 8, 2023

(30) Foreign Application Priority Data

Dec. 6, 2021 (KR) .................. 10-2021-0173182

(51) Int. Cl.
*H01L 25/065* (2023.01)
*H01L 23/00* (2006.01)
(Continued)

(52) U.S. Cl.
CPC ...... *H01L 25/0657* (2013.01); *H01L 23/3128* (2013.01); *H01L 23/49816* (2013.01); *H01L 24/48* (2013.01); *H01L 24/49* (2013.01); *H01L 24/05* (2013.01); *H01L 24/45* (2013.01); *H01L 24/85* (2013.01); *H01L 2224/05624* (2013.01);
(Continued)

(58) Field of Classification Search
CPC ... H01L 2224/4909; H01L 2224/49052; H01L 2225/06562
See application file for complete search history.

(56) References Cited

U.S. PATENT DOCUMENTS 6,900,551 B2   5/2005   Matsuzawa et al.
6,908,843 B2   6/2005   Baldonado et al.
(Continued)

FOREIGN PATENT DOCUMENTS

JP   H06-302638 A   10/1994
JP   H07-050314 A   2/1995
(Continued)

*Primary Examiner* — Yu-Hsi D Sun
(74) *Attorney, Agent, or Firm* — Harness, Dickey & Pierce, P.L.C.

(57) ABSTRACT

A semiconductor package comprising a substrate including substrate pads on a top surface thereof, a first upper semiconductor chip on the substrate and including conductive chip pads, and bonding wires coupled to the substrate pads and the first upper semiconductor chip. The bonding wires include first and second bonding wires. The substrate has a first region between the conductive chip pads and the substrate pads, and a second region between the first region and the substrate pads. The second bonding wire has a maximum vertical level on the first region of the substrate. On the first region of the substrate, the first bonding wire is at a level higher than that of the second bonding wire. On the second region of the substrate, the second bonding wire is at a level higher than that of the first bonding wire.

20 Claims, 22 Drawing Sheets

(51) Int. Cl.
*H01L 23/31* (2006.01)
*H01L 23/498* (2006.01)

(52) U.S. Cl.
CPC ............... *H01L 2224/45144* (2013.01); *H01L 2224/48091* (2013.01); *H01L 2224/48227* (2013.01); *H01L 2224/49052* (2013.01); *H01L 2224/4911* (2013.01); *H01L 2224/49176* (2013.01); *H01L 2224/49421* (2013.01); *H01L 2224/49422* (2013.01); *H01L 2224/49426* (2013.01); *H01L 2224/85424* (2013.01); *H01L 2224/85447* (2013.01); *H01L 2224/85466* (2013.01); *H01L 2224/85484* (2013.01); *H01L 2225/06506* (2013.01); *H01L 2225/0651* (2013.01); *H01L 2225/06562* (2013.01)

(56) References Cited

U.S. PATENT DOCUMENTS

| | | |
|---|---|---|
| 7,884,473 B2 | 2/2011 | Chen et al. |
| 9,123,713 B2 | 9/2015 | Crisp et al. |
| 2008/0296780 A1 | 12/2008 | Yoo |
| 2015/0333039 A1* | 11/2015 | Liu ................. H01L 23/528 257/773 |
| 2021/0217724 A1* | 7/2021 | Matsui ................ H01L 25/50 |

FOREIGN PATENT DOCUMENTS

| | | |
|---|---|---|
| JP | H11-297246 A | 10/1999 |
| JP | 3046630 B2 | 5/2000 |
| JP | 2002-0151745 A | 5/2002 |
| JP | 2005-311159 A | 11/2005 |
| JP | 2006-0261448 A | 9/2006 |
| JP | 2008-0062565 A | 3/2008 |
| JP | 2009-224350 A | 10/2009 |
| JP | 2013-243209 A | 12/2013 |
| JP | 6025016 B2 | 11/2016 |
| KR | 10 0134650 | 4/1998 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0173182 filed on Dec. 6, 2021 in the Korean Intellectual Property Office, the disclosure of which is hereby incorporated by reference in its entirety.

BACKGROUND

The present inventive concepts relate to semiconductor packages, and more particularly, to semiconductor packages including a bonding wire.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. The development of electronic industry includes fine pitch of semiconductor packages.

SUMMARY

Some example embodiments of the present inventive concepts provide semiconductor packages with increased reliability, durability, and improved electrical properties.

According to some example embodiments of the present inventive concepts, a semiconductor package may comprise: a substrate that includes a plurality of substrate pads on a top surface of the substrate; a first upper semiconductor chip on the substrate and including a plurality of conductive chip pads; and a plurality of bonding wires coupled to the substrate pads and the first upper semiconductor chip. The bonding wires may include a first bonding wire and a second bonding wire that are adjacent to each other. When viewed in plan, the substrate may have: a first region between the conductive chip pads and the substrate pads; and a second region between the first region and the substrate pads. The first and second bonding wires may define a boundary between the first and second regions as a horizontal distance from the plurality of conductive chip pads at which the first and second bonding wires have a same vertical level on the substrate. The second bonding wire may have a maximum vertical level on the first region of the substrate. On the first region of the substrate, the first bonding wire may be at a level higher than a level of the second bonding wire. On the second region of the substrate, the second bonding wire may be at a level higher than a level of the first bonding wire.

According to some example embodiments of the present inventive concepts, a semiconductor package may comprise: a substrate including a first substrate pad and a second substrate pad on a top surface of the substrate; an upper semiconductor chip on the substrate and including a plurality of conductive chip pads on a top surface of the upper semiconductor chip, the conductive chip pads including a first conductive chip pad and a second conductive chip pad that are adjacent to each other; a first upper bonding wire coupled to the first conductive chip pad and the first substrate pad; a second upper bonding wire coupled to the second conductive chip pad and the second substrate pad; a stud bump between the second conductive chip pad and the second upper bonding wire; and a fixing bump on an end portion of the first upper bonding wire. The end portion of the first upper bonding wire may be between the first substrate pad and the fixing bump. The first upper bonding wire may be in direct contact with the first conductive chip pad.

According to some example embodiments of the present inventive concepts, a semiconductor package may comprise: a substrate including a first substrate pad, a second substrate pad, and a plurality of third substrate pads, the first, second, and third substrate pads being on a top surface of the substrate; a plurality of solder balls on a bottom surface of the substrate; a lower semiconductor chip on the top surface of the substrate; a first upper semiconductor chip on a top surface of the lower semiconductor chip and including a plurality of conductive chip pads, the conductive chip pads including a first conductive chip pad and a second conductive chip pad that are adjacent to each other; a plurality of lower bonding wires coupled to the lower semiconductor chip and the third substrate pads, the lower bonding wires being adjacent to each other; a first upper bonding wire coupled to the first conductive chip pad and the first substrate pad; a second upper bonding wire coupled to the second conductive chip pad and the second substrate pad; and a molding layer on the top surface of the substrate, the molding layer covering the lower semiconductor chip, the first upper semiconductor chip, the lower bonding wires, the first upper bonding wire, and the second upper bonding wire. When viewed in plan, the substrate may have: a first region between the first conductive chip pad and the first substrate pad and between the second conductive chip pad and the second substrate pad; and a second region between the first region and the first and second substrate pads. The first and second bonding wires may define a boundary between the first and second regions as a horizontal distance from the plurality of conductive chip pads at which the first and second bonding wires have a same vertical level on the substrate. On the first region of the substrate, the first upper bonding wire may be at a level higher than a level of the second upper bonding wire. On the second region of the substrate, the second upper bonding wire may be at a level higher than a level of the first upper bonding wire. On the second region of the substrate, a vertical level difference between the lower bonding wires may be less than a vertical level difference between the first upper bonding wire and the second upper bonding wire.

DETAILED DESCRIPTION

Figure 1A:
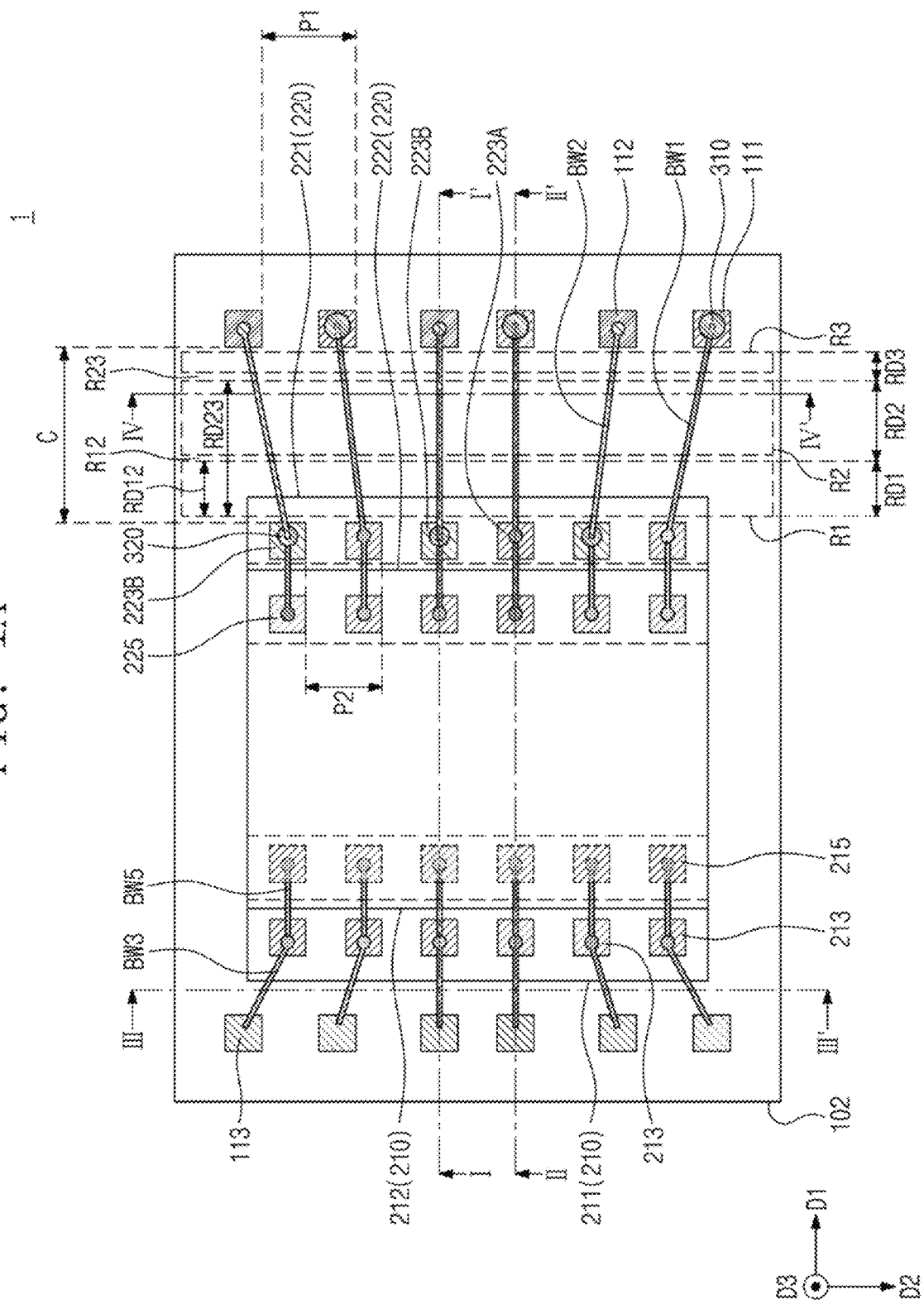
FIG. 1A illustrates a plan view showing a semiconductor package according to some example embodiments.

In this description, like reference numerals may indicate like components. The following will now describe semiconductor packages according to the present inventive concepts.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

Figure 1B:
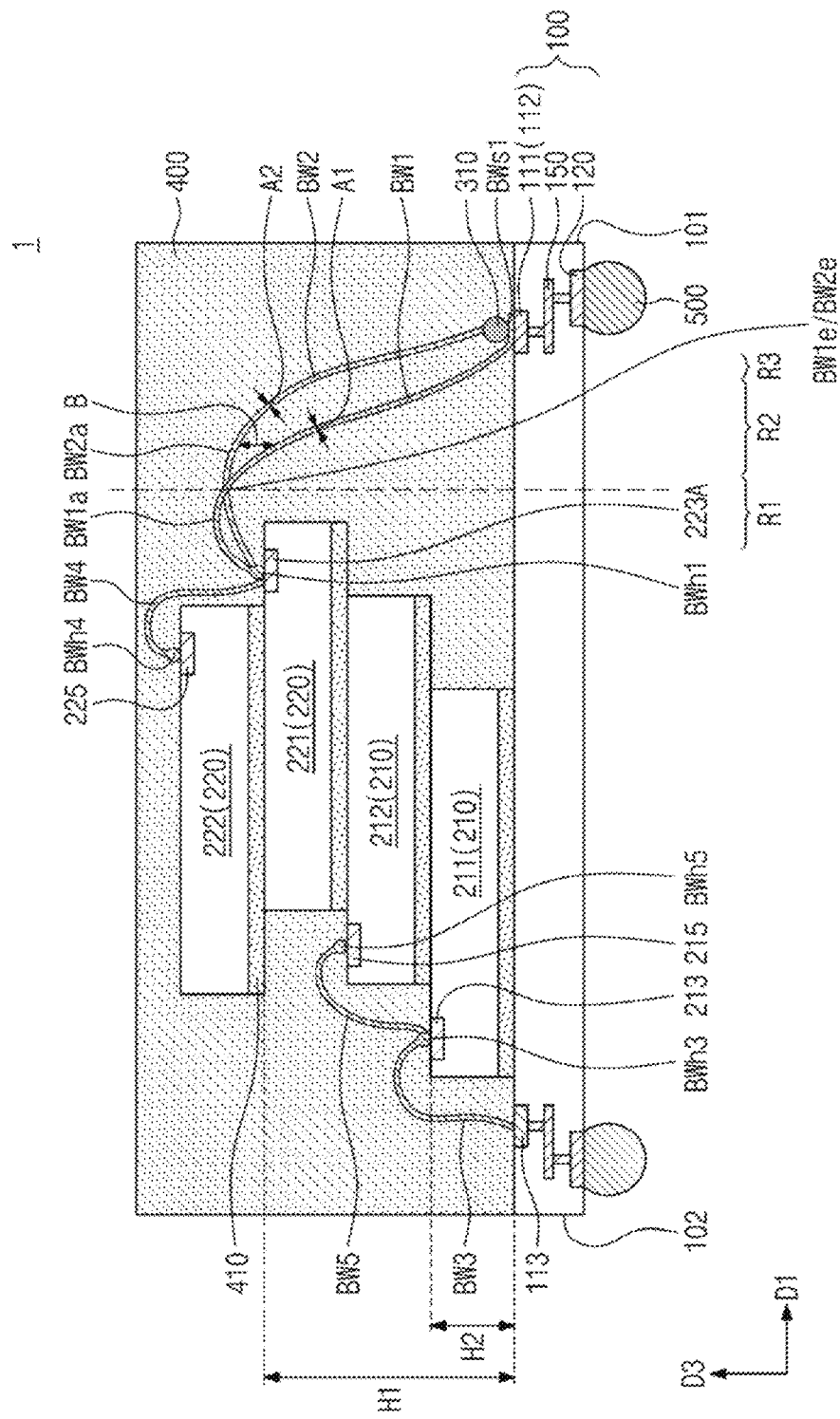
FIG. 1B illustrates a side view showing the semiconductor package of FIG. 1A according to some example embodiments.
Figure 1C:
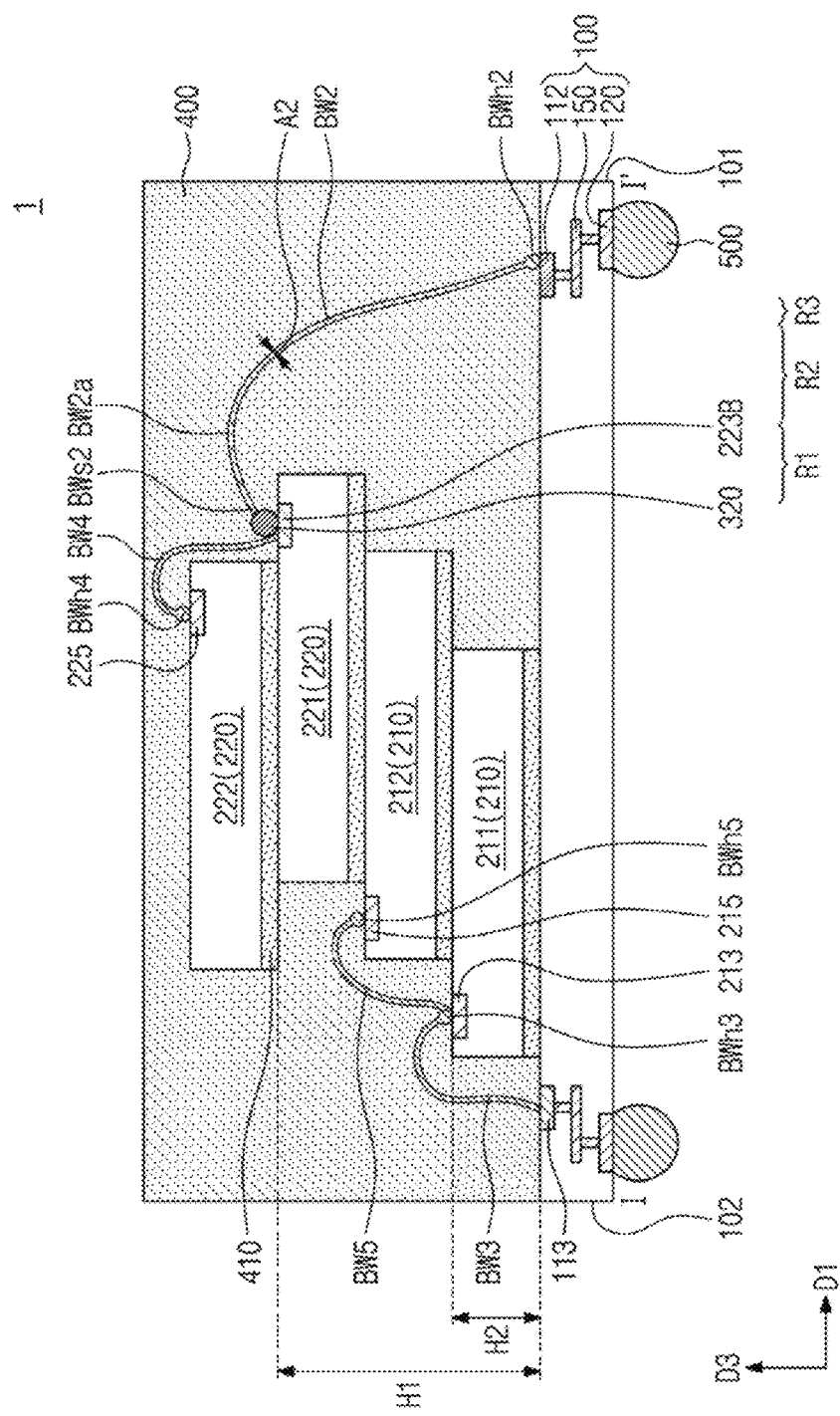
FIG. 1C illustrates a cross-sectional view taken along line I-I' of FIG. 1A according to some example embodiments.
Figure 1D:
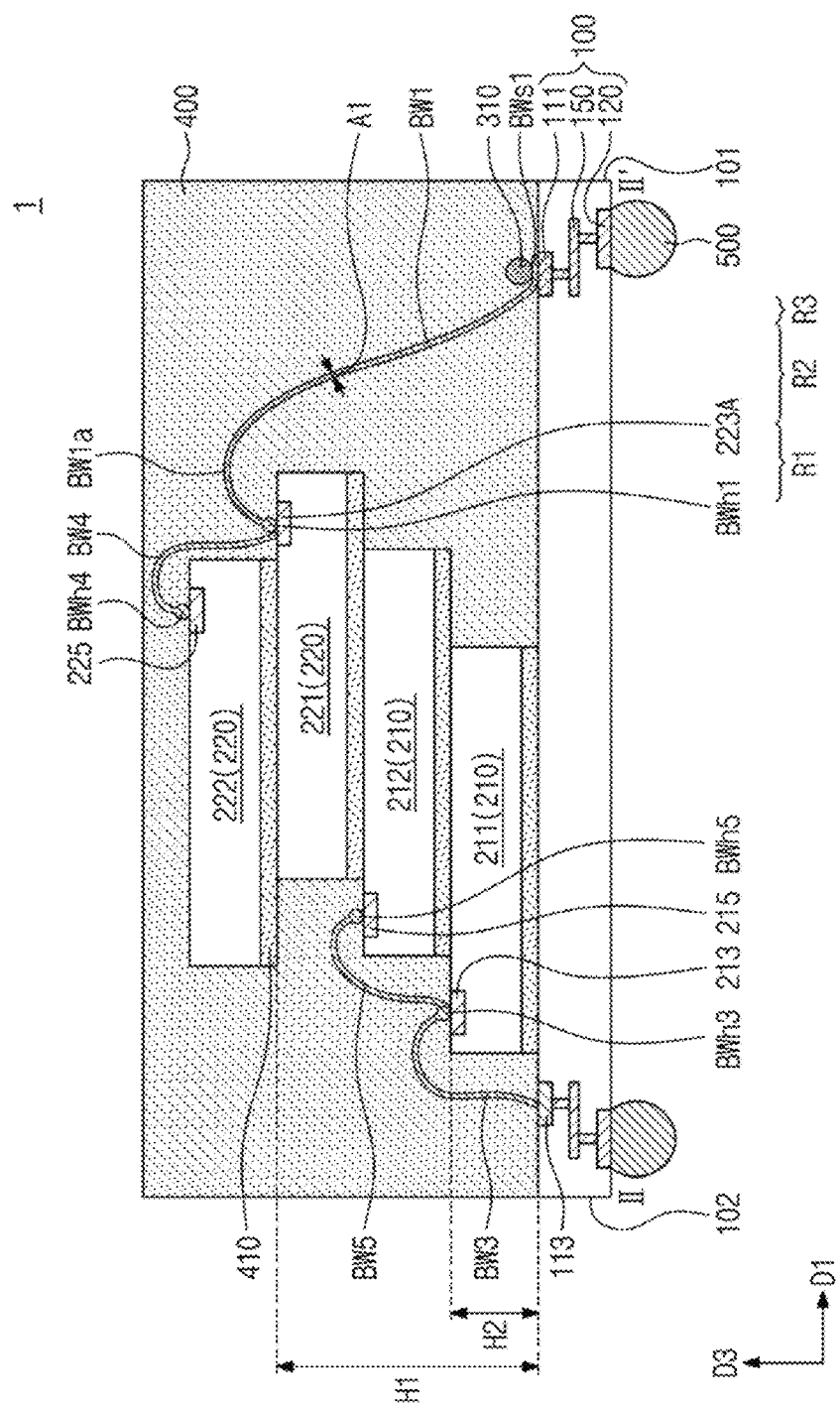
FIG. 1D illustrates a cross-sectional view taken along line II-II' of FIG. 1A according to some example embodiments.
Figure 1E:
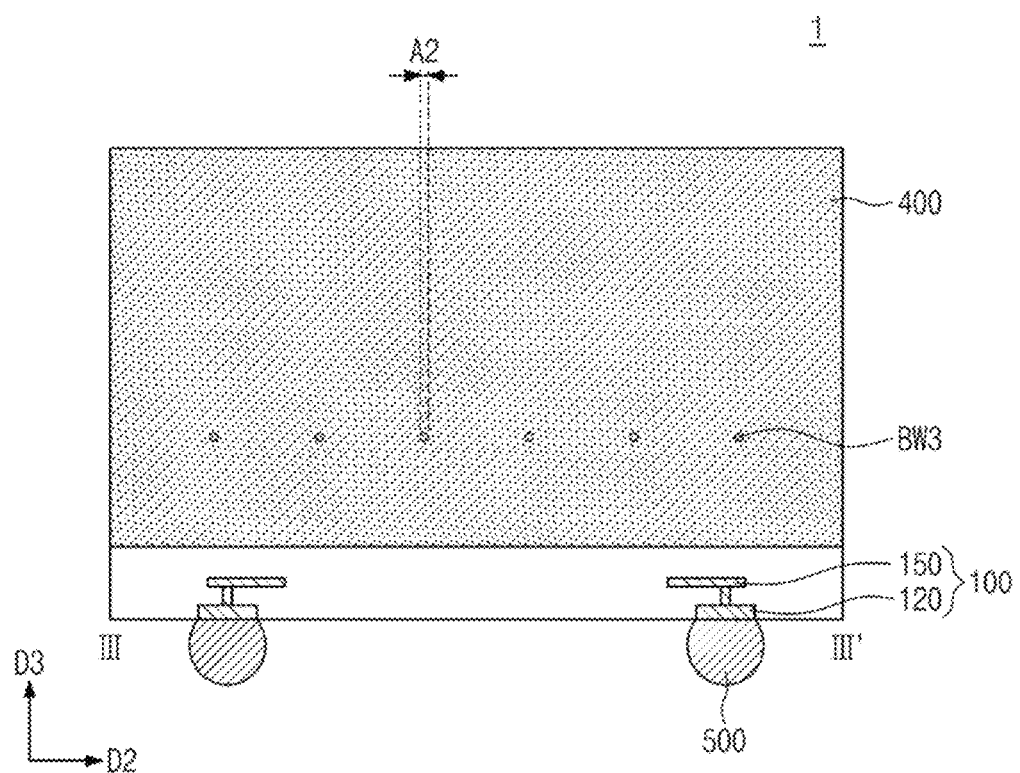
FIG. 1E illustrates a cross-sectional view taken along line III-III' of FIG. 1A according to some example embodiments.
Figure 1F:
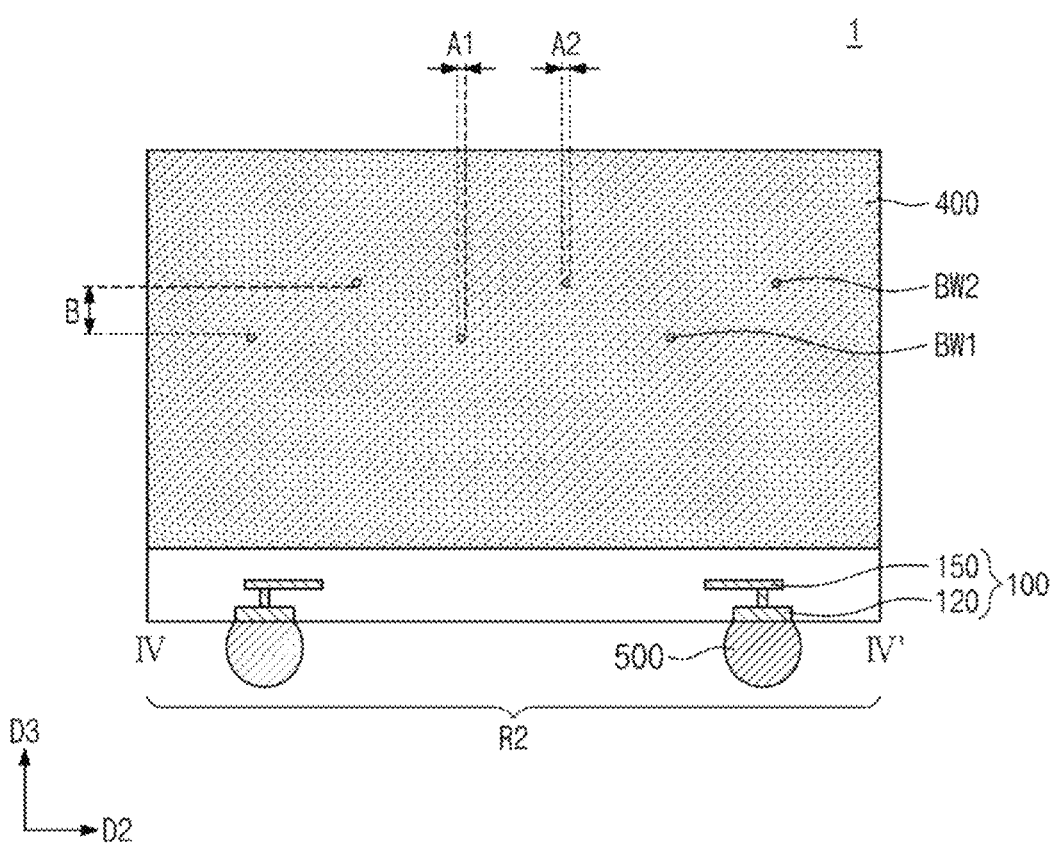
FIG. 1F illustrates a cross-sectional view taken along line IV-IV' of FIG. 1A according to some example embodiments.

FIG. 1A illustrates a plan view showing a semiconductor package according to some example embodiments. FIG. 1B illustrates a side view showing the semiconductor package of FIG. 1A according to some example embodiments. FIG. 1C illustrates a cross-sectional view taken along line I-I' of FIG. 1A according to some example embodiments. FIG. 1D illustrates a cross-sectional view taken along line II-II' of FIG. 1A according to some example embodiments. FIG. 1E illustrates a cross-sectional view taken along line III-III' of FIG. 1A according to some example embodiments. FIG. 1F illustrates a cross-sectional view taken along line IV-IV' of FIG. 1A according to some example embodiments.

Referring to FIGS. 1A to 1F, a semiconductor package 1 may include a substrate 100, a lower semiconductor chip 210, an upper semiconductor chip 220, first lower bonding wires BW3, second lower bonding wires BW5, first upper bonding wires BW1, second upper bonding wires BW2, and third upper bonding wires BW4.

The substrate 100 may include first substrate pads 111, second substrate pads 112, third substrate pads 113, lower substrate pads 120, and conductive patterns 150. For example, the substrate 100 may include a printed circuit board (PCB). The lower substrate pads 120 may be provided on a bottom surface of the substrate 100. The conductive patterns 150 may be provided in the substrate 100 and coupled to the lower substrate pads 120. The conductive patterns 150 may include vias and lines. The expression "two components are electrically connected/coupled to each other" may include the meaning "the two components are directly connected to each other or indirectly connected to each other through other conductive component(s)." The phrase "electrically connected to the substrate 100" may mean that "electrically connected to one of the first substrate pads 111, the second substrate pads 112, or the third substrate pads 113."

The first, second, and third substrate pads 111, 112, and 113 may be provided on a top surface of the substrate 100. The first, second, and third substrate pads 111, 112, and 113 may be disposed spaced apart from each other. The first, second, and third substrate pads 111, 112, and 113 may be electrically connected through the conductive patterns 150 to the lower substrate pads 120. The lower substrate pads 120, the conductive patterns 150, the first substrate pads 111, the second substrate pads 112, and the third substrate pads 113 may include metal, for example, one or more of aluminum, copper, tungsten, and titanium.

The substrate 100 may have a first lateral surface 101 and a second lateral surface 102 that are opposite to each other. A first direction D1 may be parallel to the top surface of the substrate 100. A second direction D2 may be parallel to the top surface of the substrate 100 and substantially orthogonal to the first direction D1. A third direction D3 may be substantially perpendicular to the top surface of the substrate 100.

When viewed in plan as illustrated in FIG. 1A, the first substrate pad 111 and the second substrate pad 112 may be disposed adjacent to the first lateral surface 101 of the substrate 100. When viewed in plan, each of the first and second substrate pads 111 and 112 may be spaced apart in the first direction D1 or its opposite direction from the first lateral surface 101 of the substrate 100. The first substrate pad 111 and the second substrate pad 112 may be disposed adjacent to each other. For example, no conductive pad may be provided between the first substrate pad 111 and the second substrate pad 112. The first substrate pad 111 may be provided in plural, and the second substrate pad 112 may be provided in plural. The second substrate pads 112 may be correspondingly disposed between the first substrate pads 111. When viewed in plan, the first substrate pads 111 and the second substrate pads 112 may be disposed alternately with each other. For example, the first substrate pads 111 and the second substrate pads 112 may be disposed alternately along the second direction D2. The first and second substrate pads 111 and 112 may have a first pitch P1. The first pitch P1 may be relatively small. For example, the first pitch P1 may range from about 10 μm to about 65 μm. The first pitch P1 may be an interval between lateral surfaces of the first substrate pads 111 and lateral surfaces of the second substrate pads 112. In this case, the lateral surfaces of the first substrate pads 111 and the lateral surfaces of the second substrate pads 112 may be directed in a direction parallel to the second direction D2.

When viewed in plan, the third substrate pads 113 may be disposed adjacent to the second lateral surface 102 of the substrate 100. The third substrate pads 113 may be aligned along the second direction D2, but the present inventive concepts are not limited thereto.

The semiconductor package 1 may further include solder balls 500. The solder balls 500 may be provided on bottom surfaces of the lower substrate pads 120 and coupled to the lower substrate pads 120. The solder balls 500 may include metal, such as a solder material. The solder material may include, for example, one or more of tin (Sn), silver (Ag), zinc (Zn), and any alloy thereof.

The lower semiconductor chip 210 may be disposed on the substrate 100. The lower semiconductor chip 210 may include a memory chip, such as a dynamic random access memory (DRAM). For another example, the lower semiconductor chip 210 may be a logic chip or a buffer chip.

The lower semiconductor chip 210 may include a first lower semiconductor chip 211 and a second lower semiconductor chip 212 that are stacked. The first lower semiconductor chip 211 may be mounted on the top surface of the substrate 100. When viewed in plan, the lower semiconductor chip 210 may have a pad area and a mount area. When viewed in plan, the pad area of the first lower semiconductor chip 211 may be adjacent to the second lateral surface 102 of the substrate 100. For example, the pad area of the first lower semiconductor chip 211 may be provided between the second lateral surface 102 of the substrate 100 and the mount area of the first lower semiconductor chip 211.

The first lower semiconductor chip 211 may include first lower chip pads 213 and first integrated circuits (not shown). The first integrated circuits may be provided in the first lower semiconductor chip 211. The first lower chip pads 213 may be provided on a top surface of the first lower semiconductor chip 211 and electrically connected to the first integrated circuits. The first lower chip pads 213 may be provided on the pad area of the first lower semiconductor chip 211, but not on the mount area of the first lower semiconductor chip 211. There may be a vertical interval H2 of less than about 600 μm may be provided between the top surface of the first lower semiconductor chip 211 and the top surface of the substrate 100. The vertical interval H2 between the top surface of the first lower semiconductor chip 211 and the top surface of the substrate 100 may be substantially the same as a vertical interval between top surfaces of the first lower chip pads 213 and the top surface of the substrate 100. The first lower chip pads 213 may include metal, such as aluminum.

The second lower semiconductor chip 212 may be disposed on a top surface of the first lower semiconductor chip 211. The second lower semiconductor chip 212 may be disposed offset in the first direction D1 from the first lower semiconductor chip 211. The second lower semiconductor chip 212 may be provided on a top surface at the mount area of the first lower semiconductor chip 211, and may expose a top surface at the pad area of the first lower semiconductor chip 211. Therefore, the first lower chip pads 213 may be exposed by the second lower semiconductor chip 212.

The second lower semiconductor chip 212 may be of the same type as the first lower semiconductor chip 211. The second lower semiconductor chip 212 may have the same size as that of the first lower semiconductor chip 211. As the second lower semiconductor chip 212 is disposed offset, the second lower semiconductor chip 212 may have an overhang area. When viewed in plan, the overhang area of the second lower semiconductor chip 212 may be spaced apart from the first lower semiconductor chip 211.

When viewed in plan, the second lower semiconductor chip 212 may have a pad area and a mount area. The pad area of the second lower semiconductor chip 212 may be provided between the first lower chip pads 213 and the mount area of the second lower semiconductor chip 212.

The second lower semiconductor chip 212 may include second lower chip pads 215 and second integrated circuits (not shown). The second integrated circuits may be provided in the second lower semiconductor chip 212. The second lower chip pads 215 may be provided on a top surface at the pad area of the second lower semiconductor chip 212, but not on a top surface at the mount area of the second lower semiconductor chip 212. The second lower chip pads 215 may be electrically connected to the second integrated circuits. The second lower chip pads 215 may include metal, such as aluminum.

The upper semiconductor chip 220 may be disposed on the lower semiconductor chip 210. The upper semiconductor chip 220 may include a first upper semiconductor chip 221 and a second upper semiconductor chip 222 that are stacked. The first upper semiconductor chip 221 may be stacked on the second lower semiconductor chip 212. The first upper semiconductor chip 221 may be disposed offset in the first direction D1 from the second lower semiconductor chip 212. For example, the first upper semiconductor chip 221 may be provided on the top surface at the mount area of the second lower semiconductor chip 212 and may expose the top surface at the pad area of the second lower semiconductor chip 212. Therefore, the second lower chip pads 215 may be exposed by the first upper semiconductor chip 221. The first upper semiconductor chip 221 may be of the same type as the second lower semiconductor chip 212. The first upper semiconductor chip 221 and the second lower semiconductor chip 212 may have substantially the same size.

As the first upper semiconductor chip 221 is disposed offset, the first upper semiconductor chip 221 may have an overhang area. When viewed in plan, the overhang area of the first upper semiconductor chip 221 may be spaced apart from the second lower semiconductor chip 212.

When viewed in plan, the first upper semiconductor chip 221 may have a pad area and a mount area. The pad area of the first upper semiconductor chip 221 may be provided between the mount area of the first upper semiconductor chip 221 and the first lateral surface 101 of the substrate 100.

The first upper semiconductor chip 221 may include first and second conductive chip pads 223A and 223B and third integrated circuits (not shown). The third integrated circuits may be provided in the first upper semiconductor chip 221. The first and second conductive chip pads 223A and 223B may be provided on a top surface at the pad area of the first upper semiconductor chip 221. The first and second conductive chip pads 223A and 223B may be electrically connected to the third integrated circuits. The first and second conductive chip pads 223A and 223B may include metal, such as aluminum.

The first and second conductive chip pads 223A and 223B may include a first conductive chip pad 223A and a second conductive chip pad 223B. The first and second conductive chip pads 223A and 223B may be adjacent to each other. For example, no chip pad may be provided between the first conductive chip pad 223A and the second conductive chip pad 223B. The first conductive chip pad 223A may be provided in plural, and the second conductive chip pad 223B may be provided in plural. The second conductive chip pads 223B may be provided between the first conductive chip pads 223A. When viewed in plan, the first conductive chip pads 223A and the second conductive chip pads 223B may be arranged alternately along the second direction D2. The first and second conductive chip pads 223A and 223B may have a second pitch P2. The second pitch P2 may be relatively small. For example, the second pitch P2 may range from about 10 μm to about 60 μm. The second pitch P2 may be an interval between lateral surfaces of the first conductive chip pads 223A and lateral surfaces of the second conductive chip pads 223B. In this case, the lateral surfaces of the first conductive chip pads 223A and the lateral surfaces of the second conductive chip pads 223B may be directed in a direction parallel to the second direction D2. The second pitch P2 may be less than the first pitch P1. As the second pitch P2 is relatively small, the first upper semiconductor chip 221 may become highly integrated. The second conductive chip pads 223B may include the same material as that of the first conductive chip pads 223A.

A first vertical interval H1 between a top surface of the first upper semiconductor chip 221 and the top surface of the substrate 100 may be equal to or greater than about 600 μm (e.g., about 600 μm to about 10,000 μm). The first vertical interval H1 may be the same as a vertical interval between top surfaces of the first and second conductive chip pads 223A and 223B and the top surface of the substrate 100.

The second upper semiconductor chip 222 may be disposed on a top surface of the first upper semiconductor chip 221. The second upper semiconductor chip 222 may be disposed offset from the first upper semiconductor chip 221 in a direction opposite to the first direction D1. For example, the second upper semiconductor chip 222 may be provided on the top surface at the mount area of the first upper semiconductor chip 221, and may expose a top surface at the pad area of the first upper semiconductor chip 221. Therefore, the first and second conductive chip pads 223A and 223B may be exposed by the second upper semiconductor chip 222. The second upper semiconductor chip 222 may be of the same type as that of the first upper semiconductor chip 221. The second upper semiconductor chip 222 may have substantially the same size as that of the first upper semiconductor chip 221. The second upper semiconductor chip 222 may have an overhang area. When viewed in plan, the overhang area of the second upper semiconductor chip 222 may be spaced apart from the first upper semiconductor chip 221.

The second upper semiconductor chip 222 may include upper chip pads 225 and fourth integrated circuits (not shown). The fourth integrated circuits may be provided in the second upper semiconductor chip 222. The upper chip pads 225 may be provided on the top surface of the second upper semiconductor chip 222 and electrically connected to the fourth integrated circuits. When viewed in plan, the upper chip pads 225 may be disposed adjacent to a first lateral surface of the second upper semiconductor chip 222. The first lateral surface of the second upper semiconductor chip 222 may be directed toward the first lateral surface 101 of the substrate 100. The upper chip pads 225 may include metal, such as aluminum.

The substrate 100 may have a first region R1, a second region R2, and a third region R3. When viewed in plan, the first, second, and third regions R1, R2, and R3 of the substrate 100 may be provided between the first and second conductive chip pads 223A and 223B and the first substrate pads 111 and between the first and second conductive chip pads 223A and 223B and the second substrate pads 112. The first region R1 of the substrate 100 may be adjacent to the first and second conductive chip pads 223A and 223B. The second region R2 of the substrate 100 may be provided between the first region R1 of the substrate 100 and the first and second substrate pads 111 and 112. The third region R3 of the substrate 100 may be adjacent to the first substrate pads 111 and the second substrate pads 112. For example, the third region R3 of the substrate 100 may be provided between the second region R2 of the substrate 100 and the first and second substrate pads 111 and 112.

When viewed in plan, the first and second conductive chip pads 223A and 223B may be spaced apart at a first horizontal interval C from the first and second substrate pads 111 and 112. The first horizontal interval C may be an imaginary (e.g., arbitrary) horizontal distance that is the entire distance in the first direction D1 from the first and second conductive chip pads 223A and 223B to the first and second substrate pads 111 and 112. In this description, the term "horizontal" may mean that "parallel to the top surface of the substrate 100." According to some example embodiments, when viewed in plan, the first region R1 of the substrate 100 may be spaced apart from the first and second conductive chip pads 223A and 223B toward the first and second substrate pads 111 and 112 at a distance RD1 that is greater than about 0% and equal to or less than about 30% of the first horizontal interval C. The second region R2 of the substrate 100 may be spaced apart from the first and second conductive chip pads 223A and 223B toward the first and second substrate pads 111 and 112 at a distance RD2 that is greater than about 30% and equal to or less than about 80% of the first horizontal interval C. The third region R3 of the substrate 100 may be spaced apart from the first and second conductive chip pads 223A and 223B toward the first and second substrate pads 111 and 112 at a distance RD3 that is greater than about 80% and equal to or less than about 100% of the first horizontal interval C.

As shown in at least FIG. 1A, the boundary R12 between the first and second regions R1 and R2 may be defined as being spaced apart from the first and second conductive chip pads 223A and 223B toward the first and second substrate pads 111 and 112 in the first direction D1 along a distance RD12 that is about 30% of the interval C in the first direction D1 from the first and second conductive chip pads 223A and 223B to the first and second substrate pads 111 and 112. As shown in at least FIG. 1A, the boundary R23 between the second and third regions R2 and R3 may be defined as being spaced apart from the first and second conductive chip pads 223A and 223B toward the first and second substrate pads 111 and 112 in the first direction D1 along a distance RD23 that is about 80% of the interval C in the first direction D1 from the first and second conductive chip pads 223A and 223B to the first and second substrate pads 111 and 112.

First upper bonding wires BW1 may be provided on the top surface of the first upper semiconductor chip 221. The first upper bonding wires BW1 may vertically overlap the first, second, and third regions R1, R2, and R3 of the substrate 100. The first upper bonding wires BW1 may be coupled to the first conductive chip pads 223A and the first substrate pads 111. The first upper bonding wires BW1 may each include a first end portion BWh1, a second end portion BWs1, and a body portion. The body portion of the first upper bonding wire BW1 may be provided between the first end portion BWh1 and the second end portion BWs1, and may be integrally connected with the first and second end portions BWh1 and BWs1. The formation of the first upper bonding wires BW1 may include allowing the first end portions BWh1 of the first upper bonding wires BW1 to contact the first conductive chip pads 223A and allowing the second end portions BWs1 of the first upper bonding wires BW1 to contact the first substrate pads 111. The first upper bonding wires BW1 may be formed by a forward loop process. For example, the step of allowing the second end portions BWs1 of the first upper bonding wires BW1 to contact the first substrate pads 111 may be preceded by the step of allowing the first end portions BWh1 of the first upper bonding wires BW1 to contact the first conductive chip pads 223A.

The first end portions BWh1 of the first upper bonding wires BW1 may be bonding balls. For example, the first end portions BWh1 of the first upper bonding wires BW1 may each have a spherical shape or an oval shape. The first end portions BWh1 of the first upper bonding wires BW1 may be in direct contact with the first conductive chip pads 223A. The second end portions BWs1 of the first upper bonding wires BW1 may be stitch portions. The second end portions BWs1 of the first upper bonding wires BW1 may be in direct contact with the first substrate pads 111. The first upper bonding wires BW1 may include metal, such as gold (Au).

Each of the first upper bonding wires BW1 may have a maximum vertical level (e.g., a maximum level of the entire first upper bonding wire BW1 in the vertical direction and/or third direction D3) on the first region R1 of the substrate 100. For example, the first upper bonding wires BW1 may have their respective maximum vertical levels at their respective maximum points BW1a that vertically overlap the first region R1 of the substrate 100. In this description, the expression "level of a certain component" may mean "vertical level measure in a vertical direction." The term "level" as expressed with regard to a component may refer to a distance and/or spacing of the component from a reference location (e.g., the substrate 100, the top surface of the substrate 100 that, as shown in FIG. 1B, is proximate to the molding layer 400 and may be coplanar with a top surface of at least one first substrate pad 111, a bottom surface of the substrate 100 that, as shown in FIG. 1B, may be proximate to the solder balls 500 and may be coplanar with a bottom surface of at least one lower substrate pad 120, any combination thereof, or the like. The term "vertical" may be parallel to the third direction D3 and thus may be perpendicular to the top and/or bottom surfaces of the substrate 100.

The first end portions BWh1 of the first upper bonding wires BW1 may be located at a relatively high level. For example, an interval between the first end portions BWh1 of the first upper bonding wires BW1 and the top surface of the substrate 100 may be substantially the same as the first vertical interval H1. When there is an increase in vertical interval between the first end portions BWh1 and the second end portions BWs1 of the first upper bonding wires BW1, there may be a reduction in bonding strength between the first substrate pads 111 and the second end portions BWs1 of the first upper bonding wires BW1. According to some example embodiments, the semiconductor package 1 may further include fixing bumps 310. The fixing bumps 310 may be provided on the second end portions BWs1 of the first upper bonding wires BW1. For example, the second end portions BWs1 of the first upper bonding wires BW1 may be interposed between the first substrate pads 111 and the fixing bumps 310. The fixing bumps 310 may cause the second end portions BWs1 of the first upper bonding wires BW1 to stably bond to the first substrate pads 111. Consequently, the semiconductor package 1 may improve in durability and reliability. The fixing bumps 310 may include metal, such as gold (Au) or a solder material.

As illustrated in FIGS. 1A and 1C, the second upper bonding wires BW2 may be provided on the top surface of the second upper semiconductor chip 222. The second upper bonding wires BW2 may be coupled to the second conductive chip pads 223B and the second substrate pads 112. The second upper bonding wires BW2 may each include a first end portion BWs2, a second end portion BWh2, and a body portion. The body portion of the second upper bonding wire BW2 may be provided between the first end portion BWs2 and the second end portion BWh2, and may be integrally connected with the first and second end portions BWs2 and BWh2. The first end portions BWs2 and the second end portions BWh2 of the second upper bonding wires BW2 may be respectively disposed on the second conductive chip pads 223B and the second substrate pads 112. The second upper bonding wires BW2 may include metal, such as gold (Au).

The formation of the second upper bonding wires BW2 may include allowing the first end portions BWs2 of the second upper bonding wires BW2 to electrically connect to the second conductive chip pads 223B and allowing the second end portions BWh2 of the second upper bonding wires BW2 to contact the second substrate pads 112. The second upper bonding wires BW2 may be formed by a reverse loop process. For example, the step of allowing the second upper bonding wires BW2 to contact the second substrate pads 112 may be followed by the step of allowing the second upper bonding wires BW2 to electrically connect to the second conductive chip pads 223B.

The second end portions BWh2 of the second upper bonding wires BW2 may be bonding balls. For example, the second end portions BWh2 of the second upper bonding wires BW2 may each have a spherical shape or an oval shape. The second end portions BWh2 of the second upper bonding wires BW2 may be in direct contact with the second substrate pads 112.

The first end portions BWs2 of the second upper bonding wires BW2 may be stitch portions. The semiconductor package 1 may further include stud bumps 320. The stud bumps 320 may be provided between the second conductive chip pads 223B and the second upper bonding wires BW2. The step of allowing the second upper bonding wires BW2 to electrically connect to the second conductive chip pads 223B may include allowing the second upper bonding wires BW2 to bond to the stud bumps 320. The second upper bonding wires BW2 may be coupled through the stud bumps 320 to the second conductive chip pads 223B. The stud bumps 320 may not be provided between the first conductive chip pads 223A and the first upper bonding wires BW1. The stud bumps 320 may include metal, such as gold (Au). However, the stud bumps 320 may include metal different from that of the second conductive chip pads 223B. The stud bumps 320 may each have a spherical shape or a circular shape.

An interval between the first end portions BWs2 of the second upper bonding wires BW2 and the top surface of the substrate 100 may be substantially the same as the first vertical interval H1. When the stud bumps 320 are omitted, bonding strength between the second upper bonding wires BW2 and the second conductive chip pads 223B may be relatively small due to the first vertical interval H1 that is relatively large. According to some example embodiments, the stud bumps 320 may serve as adhesive bumps. Even the first vertical interval H1 is relatively large, the second upper bonding wires BW2 may be rigidly bonded through the stud bumps 320 to the second conductive chip pads 223B. Consequently, the semiconductor package 1 may improve in durability and reliability.

The second upper bonding wires BW2 may vertically overlap the first, second, and third regions R1, R2, and R3 of the substrate 100. Each of the second upper bonding wires BW2 may have a maximum vertical level (e.g., a maximum level of the entire second upper bonding wire BW2 in the vertical direction and/or third direction D3) on the first region R1 of the substrate 100. For example, the second upper bonding wires BW2 may have their respective maximum vertical levels at their respective maximum points BW2a that vertically overlap the first region R1 of the substrate 100. As illustrated in FIG. 1B, the maximum points BW2a of the second upper bonding wires BW2 may be located at a lower level than that of the maximum points BW1a of the first upper bonding wires BW1. On the first region R1 of the substrate 100, the first upper bonding wires BW1 may be located at a vertical level higher than that of the second upper bonding wires BW2. Unless otherwise explicitly stated, a difference in vertical level between the first upper bonding wires BW1 and the second upper bonding wires BW2 may be obtained by comparing with each other values measured at positions equally spaced apart from first sidewalls of the first and second conductive chip pads 223A and 223B. For example, at any given horizontal distance in the first direction D1 from the first and second conductive chip pads 223A and 223B and towards the first and second substrate pads 111 and 112 that is also on the first region R1, a portion of a first upper bonding wire BW1 at the given horizontal distance on the first region R1 may be at a higher level than a level of a portion of an adjacent (e.g., adjacent in the second direction D2) second upper bonding wire BW2 at the same given horizontal distance on the first region R1. For example, in some example embodiments, and for example as shown in at least FIG. 1B, on an entirety of the first region R1 of the substrate, the first bonding wire BW1 may be at a level higher than a level of the second bonding wire BW2. When viewed in plan, the first sidewalls of the first and second conductive chip pads 223A and 223B may be directed toward the first lateral surface 101 of the substrate 100.

On the second region R2 of the substrate 100, the second upper bonding wires BW2 may be located at a vertical level higher than that of the first upper bonding wires BW1. For example, at any given horizontal distance in the first direction D1 from the first and second conductive chip pads 223A and 223B and towards the first and second substrate pads 111 and 112 that is also on the second region R2, a portion of a first upper bonding wire BW1 at the given horizontal distance on the second region R2 may be at a lower level than a level of a portion of an adjacent (e.g., adjacent in the second direction D2) second upper bonding wire BW2 at the same given horizontal distance on the second region R2. For example, in some example embodiments, and for example as shown in at least FIG. 1B, on an entirety of the second region R2 of the substrate, the second bonding wire BW2 may be at a level higher than a level of the first bonding wire BW1.

In some example embodiments, the boundary R12 between the first and second regions R1 and R2 may be at least partially defined as a location, line, or the like, spaced apart from the first and second conductive chip pads 223A and 223B and towards the first and second substrate pads 111 and 112 at a boundary distance RD12, where a portion of a first upper bonding wire BW1 at the boundary distance RD12 (and thus, the portion of the first upper bonding wire BW1 at the boundary R12) may be at a level BW1e that is a same level as a level BW2e of a portion of an adjacent (e.g., adjacent in the second direction D2) second upper bonding wire BW2 at the same boundary distance RD12 (and thus, also at the boundary R12). Restated, the boundary R12 may be at least partially defined as a location, line or the like, spaced apart from the first and second conductive chip pads 223A and 223B and towards the first and second substrate pads 111 and 112 in the first direction D1, at which the respective levels BW1e and BW2e of at least two adjacent first and second upper bonding wires BW1 and BW2 are a same level (e.g., a horizontal distance from the first and second conductive chip pads 223A and 223B at which the first and second bonding wires BW1 and BW2) have a same vertical level (e.g., in the third direction D3) on the substrate 100.

As the first vertical interval H1 is relatively large, at least one of the first or second upper bonding wires BW1 or BW2 may become tilted. When the first and second upper bonding wires BW1 and BW2 are substantially the same in terms of shape and vertical level, at least two neighboring ones of the first and second upper bonding wires BW1 and BW2 may contact each other to induce the occurrence of electric short.

According to some example embodiments, the first upper bonding wires BW1 and the second upper bonding wires BW2 may be disposed alternately with each other along the second direction D2. On the first and second regions R1 and R2 of the substrate 100, the first upper bonding wires BW1 may be located at a vertical level different from that of the second upper bonding wires BW2. Therefore, even though one of the first or second upper bonding wires BW1 or BW2 is tilted, the first and second upper bonding wires BW1 and BW2 may not be in contact with each other. An electric short may be prevented, or the likelihood of the electric short occurring may be reduced, between the first and second upper bonding wires BW1 and BW2. As a result of reducing or preventing the likelihood of electric short between the first and second upper bonding wires BW1 and BW2 based on the vertical level locations of the first and second upper bonding wires BW1 and BW2 in the first and second regions R1 and R2 as described herein (e.g., based on the first and second bonding wires defining a boundary between the first and second regions as a horizontal distance from the plurality of conductive chip pads at which the first and second bonding wires have a same vertical level on the substrate, wherein the first bonding wire has a maximum vertical level on the first region of the substrate, wherein on the first region R1 of the substrate 100, the first bonding wire BW1 is at a level higher than a level of the second bonding wire BW2, and wherein, on the second region R2 of the substrate 100, the second bonding wire BW2 is at a level higher than a level of the first bonding wire BW1), the performance and/or reliability of the semiconductor package 1 may be increased.

Therefore, there may be a reduction in restriction on the first pitch P1 and the second pitch P2. For example, the first and second pitches P1 and P2 may be decreased. The semiconductor package 1 may be become highly integrated and thus may have improved compactness and/or size efficiency without degradation of reliability and/or performance (due to the reduced or prevented risk of electrical short between the first and second upper bonding wires BW1 and BW2).

According to some example embodiments, even though the first vertical interval H1 is relatively large, the fixing bumps 310 and the stud bumps 320 may cause the first and second upper bonding wires BW1 and BW2 to stably bond to the substrate 100 and the first upper semiconductor chip 221. Therefore, there may be a reduction in limitation imposed on the number (e.g., quantity) of stacked lower semiconductor chips 210 and of stacked upper semiconductor chips 220. For example, the number (e.g., quantity) of the lower semiconductor chips 210 and of the upper semiconductor chips 220 may not be limited to that shown. The total number of the lower and upper semiconductor chips 210 and 220 may be 16, 32, and so forth. Accordingly, the semiconductor package 1 may improve in performance based on having a reduced limitation on quantity of stacked lower semiconductor chips 210 and of stacked upper semiconductor chips 220.

On the second region R2 of the substrate 100, a relatively large vertical level difference B may be provided between the second upper bonding wires BW2 and the first upper bonding wires BW1, which may result from the first and second bonding wires defining a boundary between the first and second regions as a horizontal distance from the plurality of conductive chip pads at which the first and second bonding wires have a same vertical level on the substrate, the first bonding wire having a maximum vertical level on the first region R1 of the substrate 100, the first bonding wire BW1 being at a level higher than a level of the second bonding wire BW2 on the first region R1 of the substrate 100, and the second bonding wire BW2 being at a level higher than a level of the first bonding wire BW1 on the second region R2 of the substrate 100. The vertical level difference B between the second upper bonding wires BW2 and the first upper bonding wires BW1 may be equal to or greater than about one times a diameter A1 of the first upper bonding wires BW1. The vertical level difference B between the second upper bonding wires BW2 and the first upper bonding wires BW1 may be equal to or greater than about one times a diameter A2 of the second upper bonding wires BW2. Accordingly (e.g., based on the vertical level difference B resulting from the first and second bonding wires defining a boundary between the first and second regions as a horizontal distance from the plurality of conductive chip pads at which the first and second bonding wires have a same vertical level on the substrate, the first bonding wire having a maximum vertical level on the first region R1 of the substrate 100, the first bonding wire BW1 being at a level higher than a level of the second bonding wire BW2 on the first region R1 of the substrate 100, and the second bonding wire BW2 being at a level higher than a level of the first bonding wire BW1 on the second region R2 of the substrate 100), an electric short may be effectively prevented between the first and second upper bonding wires BW1 and BW2, or at least the likelihood of such electric short may be reduced, based on the improved spacing difference (e.g., via vertical level difference B) between the first and second upper bonding wires BW1 and BW2.

The semiconductor package 1 may further include third upper bonding wires BW4. The third upper bonding wires BW4 may be provided on the top surface of the second upper semiconductor chip 222 and the top surface of the first upper semiconductor chip 221. The third upper bonding wires BW4 may be coupled to the upper chip pads 225 and the first and second conductive chip pads 223A and 223B. An interval between opposite end portions of the third upper bonding wire BW4 may be less than an interval between the first and second end portions BWh1 and BWs1 of the first upper bonding wire BW1 and an interval between the first and second end portions BWh2 and BWs2 of the second upper bonding wire BW2. The third upper bonding wires BW4 may have their first end portions BWh4 in contact with the upper chip pads 225. No stud bumps may be separately provided between the first and second conductive chip pads 223A and 223B and the first end portions BWh4 of the third upper bonding wires BW4. The first end portions BWh4 of the third upper bonding wires BW4 may each have a circular shape or a spherical shape.

The third upper bonding wires BW4 may be formed by the same method. For example, a forward loop process may be employed to form the third upper bonding wires BW4. Accordingly, the third upper bonding wires BW4 may be fabricated in simplicity and at high efficiency.

The second upper semiconductor chip 222 may be electrically connected to the substrate 100 through the third upper bonding wires BW4, the upper chip pads 225, and the first and second upper bonding wires BW1 and BW2.

The third upper bonding wires BW4 may be provided at substantially the same or similar levels. For example, on the second region R2, a vertical level difference between the third upper bonding wires BW4 may be less than the vertical level difference B between the first upper bonding wires BW1 and the second upper bonding wires BW2. The vertical level difference between the third upper bonding wires BW4 may be obtained by comparing with each other values measured at positions equally spaced apart from first sidewalls of the upper chip pads 225. When viewed in plan, the first sidewalls of the upper chip pads 225 may be directed toward the first lateral surface 101 of the substrate 100.

The semiconductor package 1 may further include first lower bonding wires BW3. The first lower bonding wires BW3 may be provided on the top surface of the first lower semiconductor chip 211. The first lower bonding wires BW3 may be coupled to the first lower chip pads 213 and the third substrate pads 113. The first lower bonding wires BW3 may include first end portions BWh3, second end portions, and body portions. The body portion of the first lower bonding wire BW3 may be provided between the first end portion BWh3 and the second end portion of the first lower bonding wire BW3, and may be integrally connected with the first end portion BWh3 and the second end portion of the first lower bonding wires BW3. The first end portions BWh3 of the first lower bonding wires BW3 may be provided on the first lower chip pads 213. The second end portions of the third lower bonding wires BW3 may be provided on the third substrate pads 113.

A vertical interval between the first end portions BWh3 of the first lower bonding wires BW3 and the top surface of the substrate 100 may be substantially the same as the vertical interval H2 between the top surface of the first lower semiconductor chip 211 and the top surface of the substrate 100. For example, a value of less than about 600 μm may be given as the vertical interval between the first end portions BWh3 of the first lower bonding wires BW3 and the top surface of the substrate 100. The first lower bonding wires BW3 may be formed by the same method. For example, a forward loop process may be employed to form the first lower bonding wires BW3. Thus, the first lower bonding wires BW3 may be formed in simplicity.

The first end portions BWh3 of the first lower bonding wires BW3 may be bonding balls, and the second end portions of the first lower bonding wires BW3 may be stitch portions. The first end portions BW3$h$ of the first lower bonding wires BW3 may each have a circular shape or a spherical shape. No stud bumps may be separately provided between the first lower chip pads 213 and the first end portions BWh3 of the first lower bonding wires BW3. The first end portions BWh3 of the first lower bonding wires BW3 may be in direct contact with the first lower chip pads 213. The second end portions of the first lower bonding wires BW3 may be in contact with the third substrate pads 113. No fixing bumps may be separately provided on the second end portions of the first lower bonding wires BW3.

The semiconductor package 1 may further include second lower bonding wires BW5. The second lower bonding wires BW5 may be provided on the top surface of the first lower semiconductor chip 211 and the top surface of the second lower semiconductor chip 212. The second lower bonding wires BW5 may be coupled to the second lower chip pads 215 and the first lower chip pads 213. The second lower bonding wires BW5 may include first end portions BWh5, second end portions, and body portions. The body portion of the second lower bonding wire BW5 may be provided between the first end portion BWh5 and the second end portion of the second lower bonding wire BW5, and may be integrally connected with the first end portion BWh5 and the second end portion of the second lower bonding wires BW5. The first end portions of the second lower bonding wires BW5 may be provided on the second lower chip pads 215. The second end portions of the second lower bonding wires BW5 may be provided on the first lower chip pads 213.

An interval between the first end portion BW5$h$ and the second end portion of the second lower bonding wire BW5 may be less than the interval between the opposite end portions BWh1 and BWs1 of the first upper bonding wire BW1 and the interval between the opposite end portions BWs2 and BWh2 of the second upper bonding wire BW2. The second lower bonding wires BW5 may be formed by the same method. For example, a forward loop process may be employed to form the second lower bonding wires BW5.

The first end portions BWh5 of the second lower bonding wires BW5 may be bonding balls, and the second end portions of the second lower bonding wires BW5 may be stitch portions. The first end portions BW5$h$ of the second lower bonding wires BW5 may each have a circular shape or a spherical shape. The first end portions BWh5 of the second lower bonding wires BW5 may be in direct contact with the second lower chip pads 215. No stud bumps may be separately provided between the second lower bonding wires BW5 and the second lower chip pads 215. The second end portions of the second lower bonding wires BW5 may be in contact with the first lower chip pads 213. No fixing bumps may be separately provided on the second end portions of the second lower bonding wires BW5. The second lower bonding wires BW5 may include metal, such as gold (Au). The second lower semiconductor chip 212 may be coupled through the first lower chip pads 213 to the substrate 100.

The semiconductor package 1 may further include a molding layer 400. The molding layer 400 may be provided on the top surface of the substrate 100, thereby covering the lower semiconductor chips 210 and the upper semiconductor chips 220. The molding layer 400 may encapsulate the first lower bonding wires BW3, the second lower bonding wires BW5, the first upper bonding wires BW1, the second upper bonding wires BW2, and the third upper bonding wires BW4. The molding layer 400 may include a dielectric polymer, such as an epoxy-based molding compound. As illustrated in FIG. 1D, the fixing bumps 310 may not be separately provided on the second end portions BWh2 of the second upper bonding wires BW2. The second end portions BWh2 of the second upper bonding wires BW2 may be covered with the molding layer 400. The fixing bumps 310 may not be separately provided on the second end portions of the second lower bonding wires BW5. The second end portions of the second lower bonding wires BW5 may be covered with the molding layer 400.

The semiconductor package 1 may further include adhesion layers 410. The adhesion layers 410 may be correspondingly provided on bottom surfaces of the lower semiconductor chips 210 and bottom surfaces of the upper semiconductor chips 220. For example, the adhesion layers 410 may be provided on a bottom surface of the first lower semiconductor chip 211, a bottom surface of the second lower semiconductor chip 212, a bottom surface of the first upper semiconductor chip 221, and a bottom surface of the second upper semiconductor chip 222. The adhesion layers 410 may be die attach films. The adhesion layers 410 may include, for example, a dielectric polymer.

Figure 2:
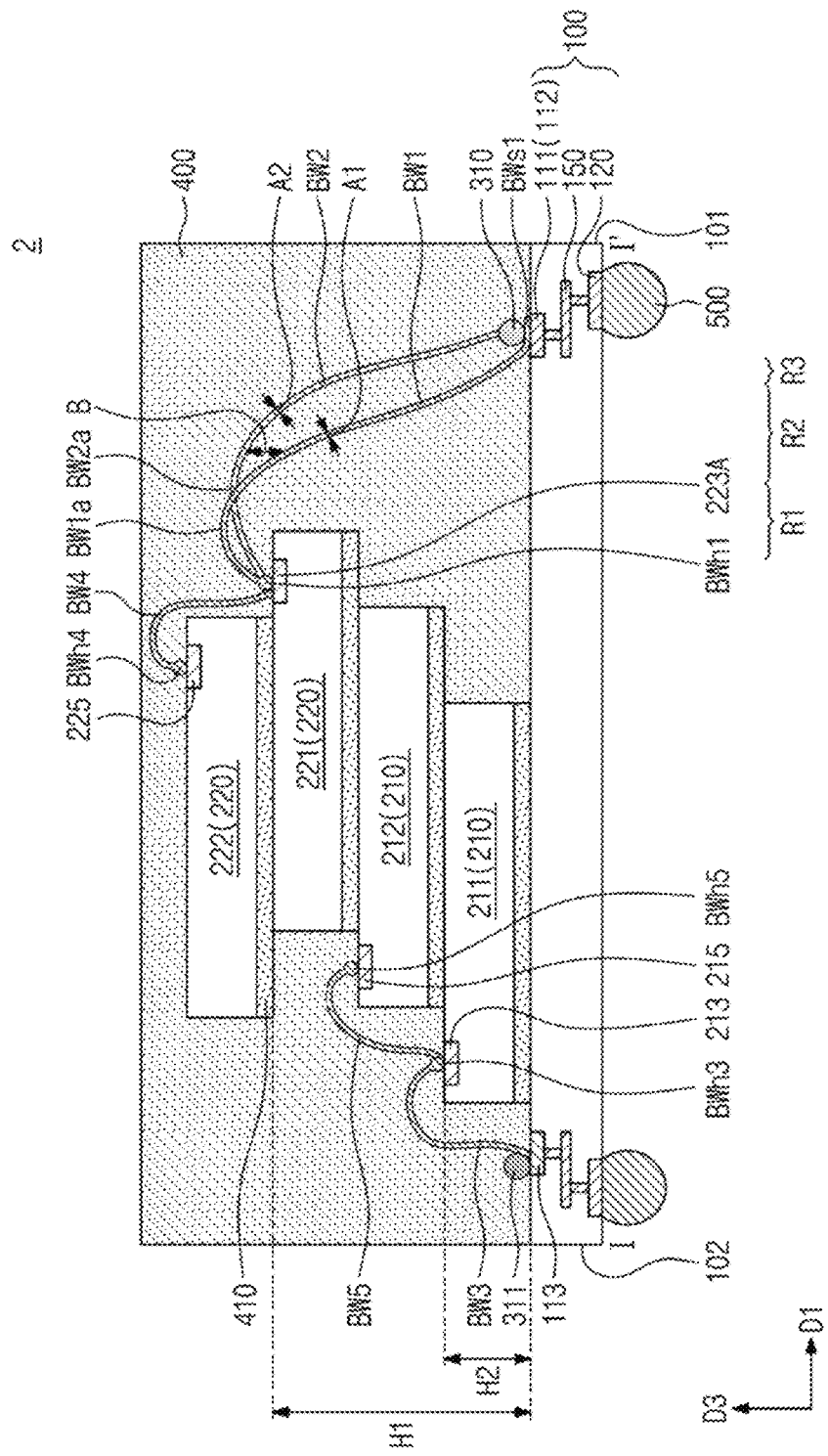
FIG. 2 illustrates a side view showing a semiconductor package according to some example embodiments.

FIG. 2 illustrates a side view showing a semiconductor package according to some example embodiments. In explaining FIGS. 2 and 3A to 3C, for brevity of description, the following will discuss a single third substrate pad, a single first lower bonding wire, a single second lower bonding wire, a single first upper bonding wire, a single second upper bonding wire, and a single third upper bonding wire.

Referring to FIG. 2, a semiconductor package 2 may include a substrate 100, solder balls 500, a lower semiconductor chip 210, an upper semiconductor chip 220, a first lower bonding wire BW3, a second lower bonding wire BW5, a first upper bonding wire BW1, a second upper bonding wire BW2, a third upper bonding wire BW4, a stud bump 320, a fixing bump 310, and a molding layer 400.

The semiconductor package 2 may further include a conductive fixing bump 311. The first lower bonding wire BW3 may have a second end portion coupled to a third substrate pad 113. The conductive fixing bump 311 may be provided on the second end portion of the third lower bonding wire BW3. For example, the first lower bonding wire BW3 may be interposed between the third substrate pad 113 and the conductive fixing bump 311. The conductive fixing bump 311 may rigidly bond the first lower bonding wire BW3 to the third substrate pad 113. The conductive fixing bump 311 may include metal, such as gold (Au).

Figure 3A:
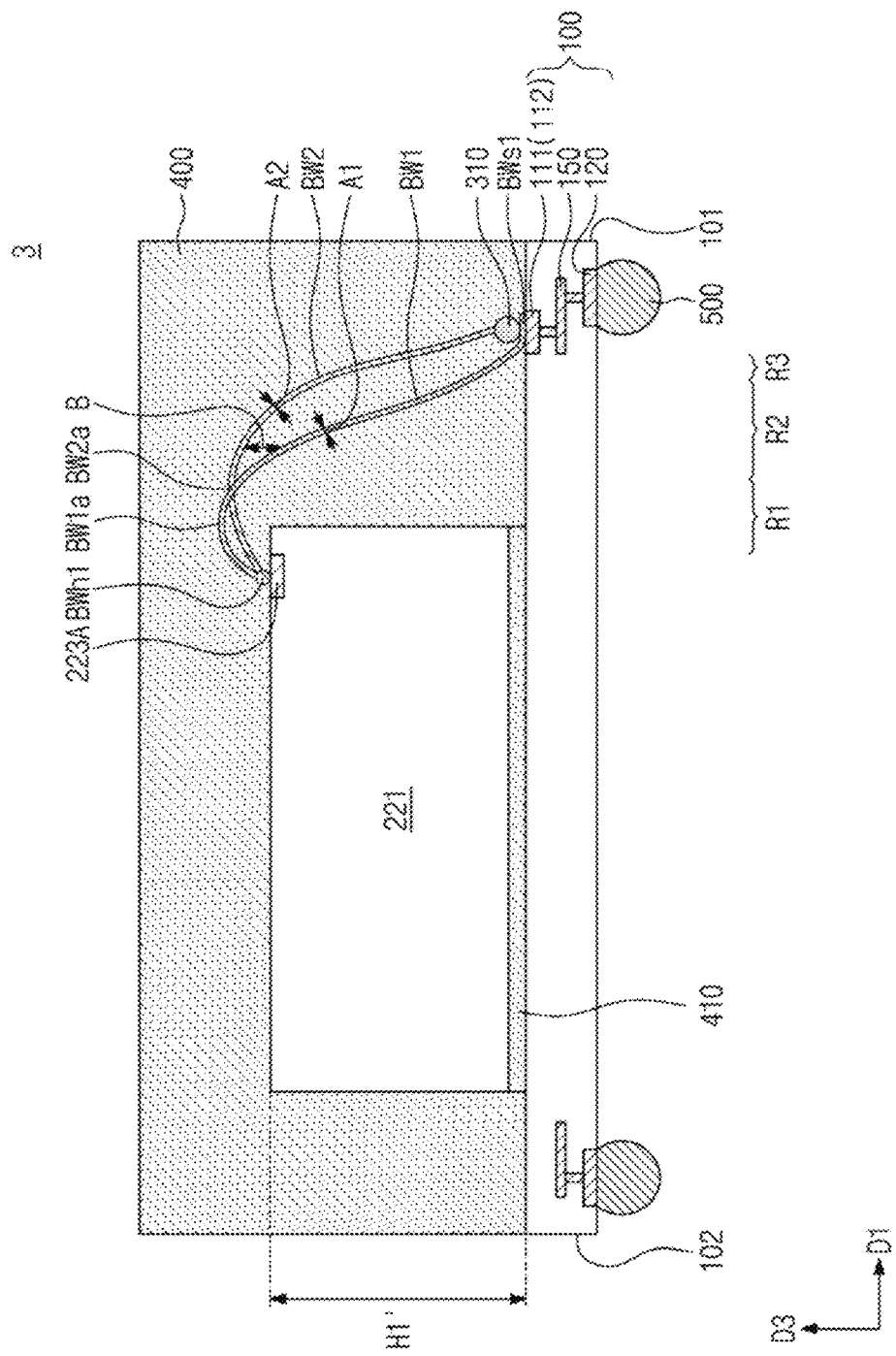
FIG. 3A illustrates a side view showing a semiconductor package according to some example embodiments.
Figure 3B:
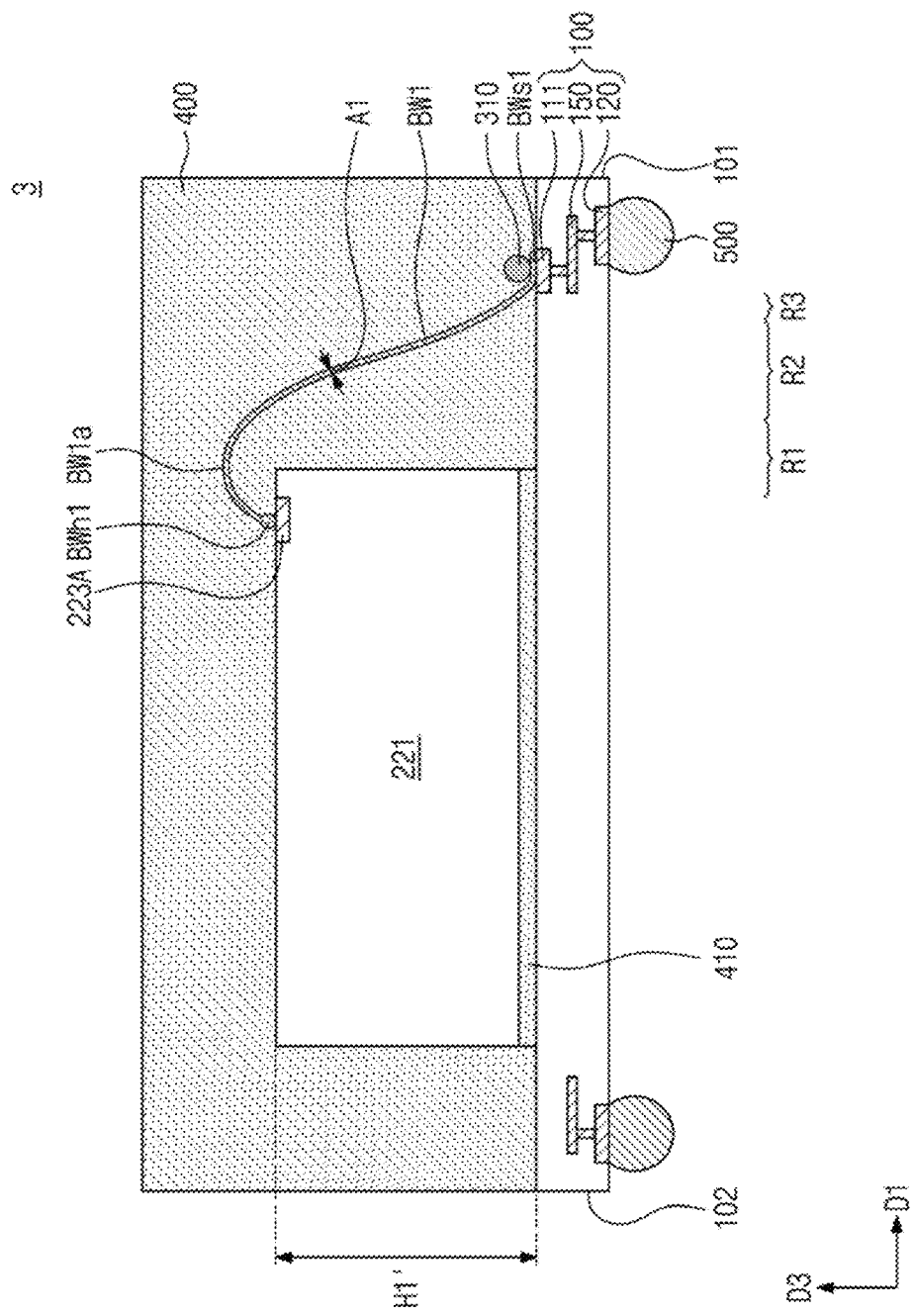
FIG. 3B illustrates a cross-sectional view taken along one line of the semiconductor package shown in FIG. 3A according to some example embodiments.
Figure 3C:
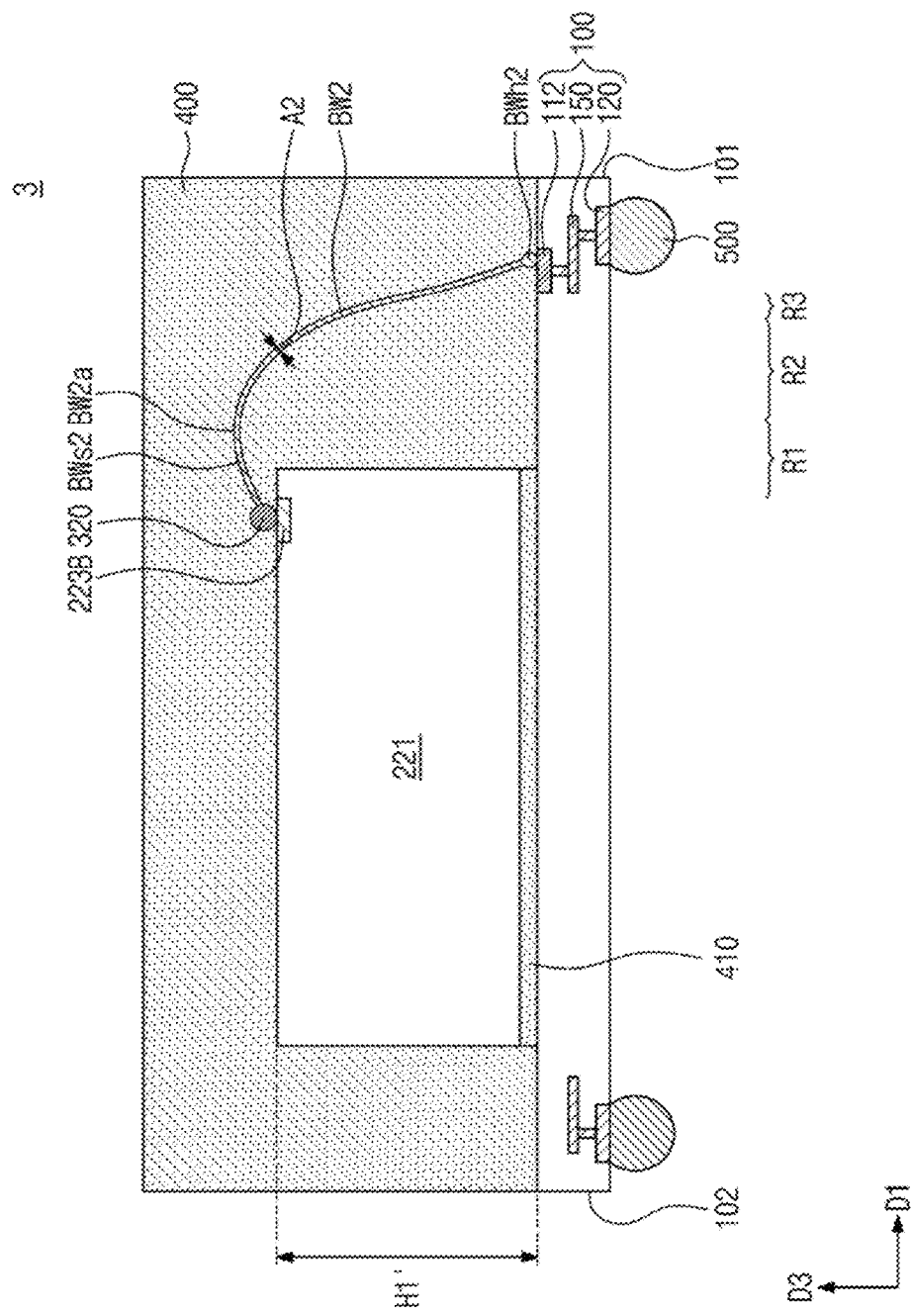
FIG. 3C illustrates a cross-sectional view taken along one line of the semiconductor package shown in FIG. 3A according to some example embodiments.

FIG. 3A illustrates a side view showing a semiconductor package according to some example embodiments. FIG. 3B illustrates a cross-sectional view taken along one line of the semiconductor package shown in FIG. 3A according to some example embodiments. FIG. 3C illustrates a cross-sectional view taken along one line of the semiconductor package shown in FIG. 3A according to some example embodiments. The following description in FIGS. 3A to 3C will refer to FIG. 1A.

Referring to FIGS. 3A to 3C, a semiconductor package 3 may include a substrate 100, a first upper semiconductor chip 221, solder balls 500, a first upper bonding wire BW1, a second upper bonding wire BW2, a stud bump 320, a fixing bump 310, an adhesion layer 410, and a molding layer 400. The semiconductor package 3 may not include any of the first lower semiconductor chip 211, the second lower semiconductor chip 212, and the second upper semiconductor chip 222 discussed in the examples of FIGS. 1A to 1D. The substrate 100 may not include the third substrate pads 113. The adhesion layer 410 may attach the first upper semiconductor chip 221 to the substrate 100. A first vertical interval H1' between a top surface of the first upper semiconductor chip 221 and a top surface of the substrate 100 may be greater than about 600 μm.

The first upper bonding wire BW1 and the second upper bonding wire BW2 may be substantially the same as those discussed in the example of FIGS. 1A to 1D and 1F. For example, the first upper bonding wire BW1 and the second upper bonding wire BW2 may be adjacent to each other. As illustrated in FIG. 3B, the first end portion BWh1 of the first upper bonding wire BW1 may be in direct contact with the first conductive chip pad 223A. The second end portion BWs1 of the first upper bonding wire BW1 may be interposed between the first substrate pad 111 and the fixing bump 310. The second end portion BWs1 of the first upper bonding wire BW1 may be in direct contact with the first substrate pad 111.

As illustrated in FIG. 3C, the second upper bonding wire BW2 may be electrically connected to the second conductive chip pad 223B and the second substrate pad 112. A stud bump 320 may be provided between the second conductive chip pad 223B and the first end portion BWs2 of the second upper bonding wire BW2. The first end portion BWs2 of the second upper bonding wire BW2 may be in direct contact with the stud bump 320. The second end portion BWh2 of the second upper bonding wire BW2 may be in direct contact with the second substrate pad 112.

As illustrated in FIG. 3A, the first upper bonding wire BW1 and the second upper bonding wire BW2 may have their maximum vertical levels (e.g., maximum level in the vertical direction and/or third direction D3) on the first region R1 of the substrate 100. The first upper bonding wire BW1 and the second upper bonding wire BW2 may respectively have a maximum point BW1a and a maximum point BW2a which are the points of the maximum vertical levels of the first and second upper bonding wires BW1 and BW2, respectively, that vertically overlap the first region R1 of the substrate 100. On the first region R1 of the substrate 100, the first upper bonding wire BW1 may be located at a vertical level higher than that of the second upper bonding wire BW2.

On the second region R2 of the substrate 100, the second upper bonding wire BW2 may be located at a vertical level higher than that of the first upper bonding wire BW1. A vertical level difference B between the second upper bonding wire BW2 and the first upper bonding wire BW1 may be equal to or greater than about one times a diameter A1 of the first upper bonding wire BW1. The vertical level difference B between the second upper bonding wire BW2 and the first upper bonding wire BW1 may be equal to or greater than about one times a diameter A2 of the second upper bonding wire BW2. Therefore (e.g., based on the vertical level difference B provided due to the structures and levels of the first and second upper bonding wires BW1 and BW2), the occurrence of electric short may be prevented between the first and second upper bonding wires BW1 and BW2, or at least the likelihood of the electric short occurrence may be reduced, thereby improving semiconductor package reliability and/or performance.

Figure 4A:
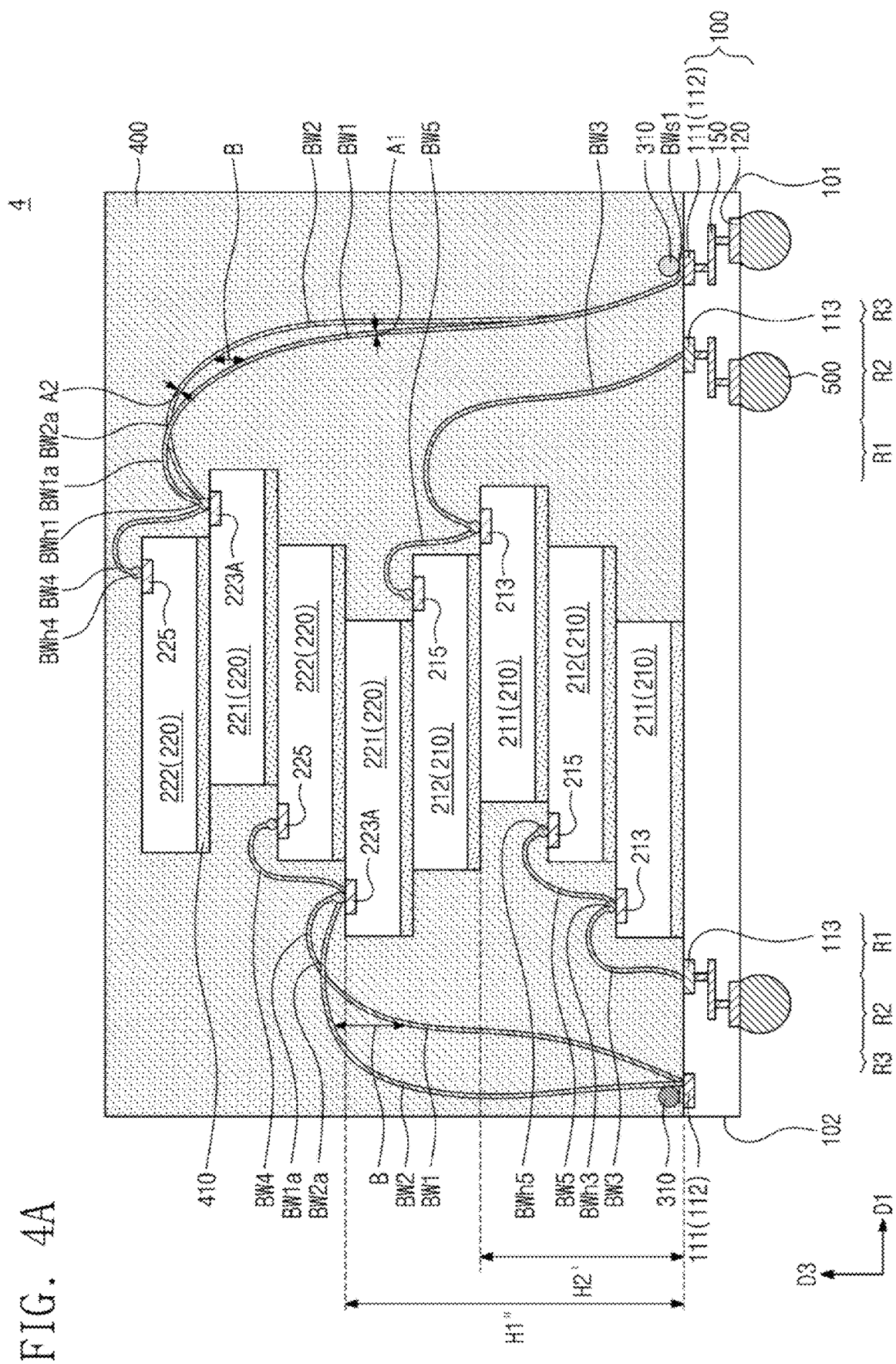
FIG. 4A illustrates a side view showing a semiconductor package according to some example embodiments.
Figure 4B:
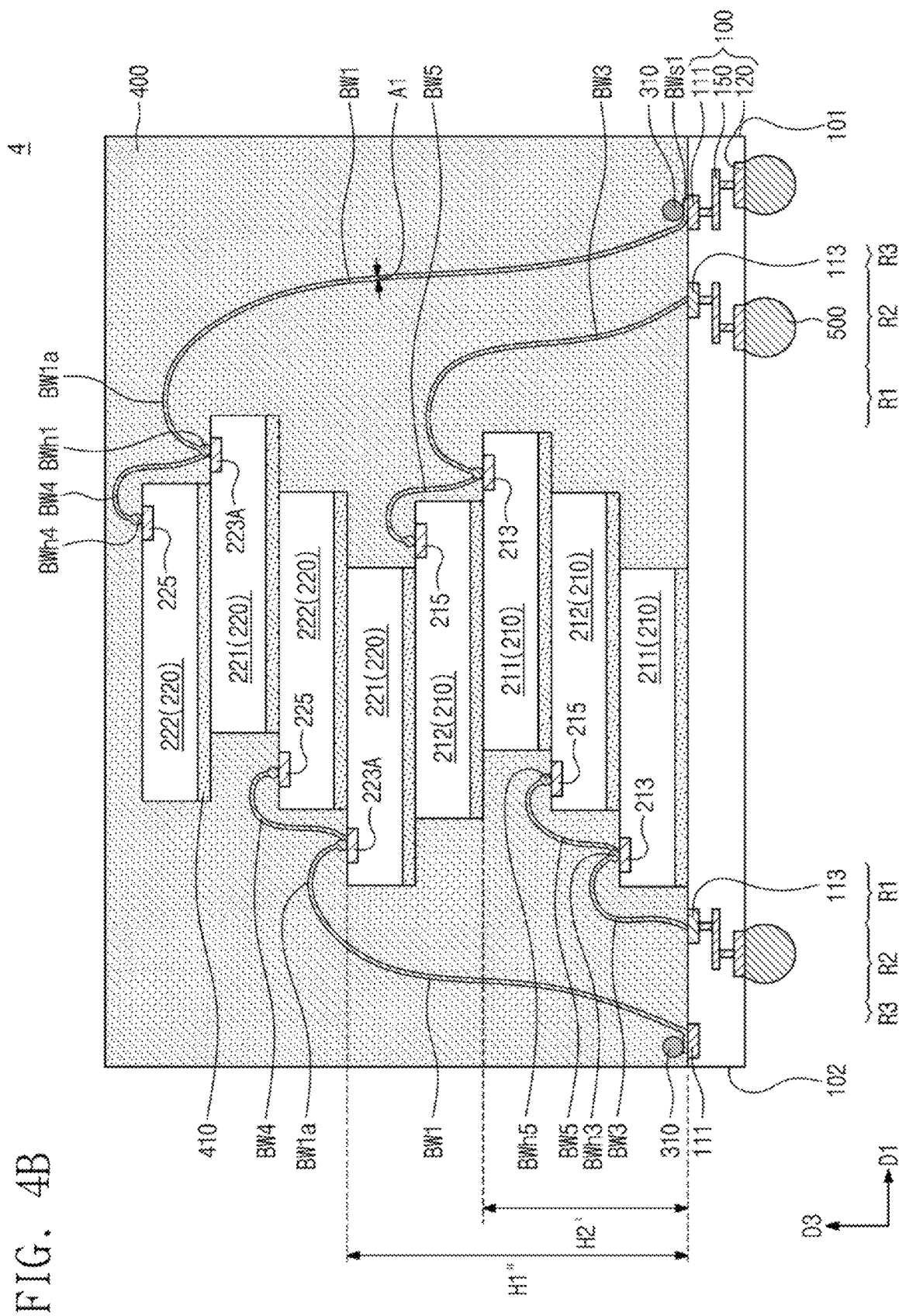
FIG. 4B illustrates a cross-sectional view taken along one line of the semiconductor package shown in FIG. 4A according to some example embodiments.
Figure 4C:
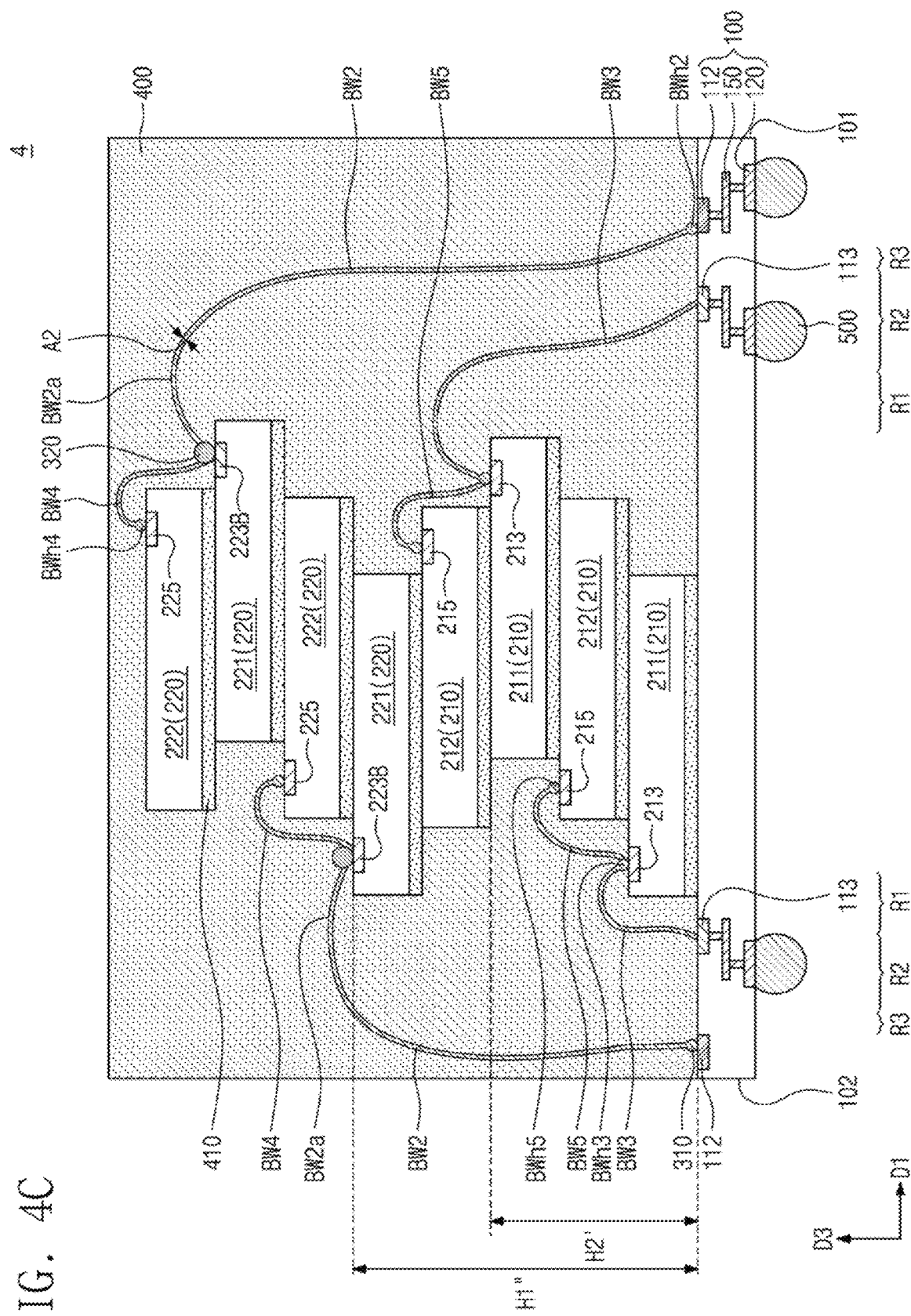
FIG. 4C illustrates a cross-sectional view taken along one line of the semiconductor package shown in FIG. 4A according to some example embodiments.

FIG. 4A illustrates a side view showing a semiconductor package according to some example embodiments. FIG. 4B illustrates a cross-sectional view taken along one line of the semiconductor package shown in FIG. 4A according to some example embodiments. FIG. 4C illustrates a cross-sectional view taken along one line of the semiconductor package shown in FIG. 4A according to some example embodiments.

Referring to FIGS. 4A to 4C, a semiconductor package 4 may include a substrate 100, solder balls 500, lower semiconductor chips 210, upper semiconductor chips 220, first lower bonding wires BW3, second lower bonding wires BW5, first upper bonding wires BW1, second upper bonding wires BW2, third upper bonding wires BW4, stud bumps 320, fixing bumps 310, and a molding layer 400. The semiconductor package 4 may further include adhesion layers 410.

The lower semiconductor chips 210 may include a plurality of first lower semiconductor chips 211 and a plurality of second lower semiconductor chips 212. The first lower semiconductor chips 211 and the second lower semiconductor chips 212 may be stacked alternately with each other. The first lower semiconductor chips 211 and the second lower semiconductor chips 212 may have a stepwise stack structure. For example, the second lower semiconductor chips 212 may be shifted in the first direction D1 or its opposite direction from the first lower semiconductor chips 211. The second lower semiconductor chips 212 may expose the first lower chip pads 213. The second lower semiconductor chips 212 may be shifted in the first direction D1 or its opposite direction from the first lower semiconductor chips 211 on bottom surfaces of the second lower semiconductor chips 212. A second vertical interval H2' between a top surface of an uppermost first lower semiconductor chip 211 and a top surface of the substrate 100 may be less than about 600 μm.

The first lower bonding wires BW3 may be coupled to the first lower chip pads 213 and the third substrate pads 113. The second lower bonding wires BW5 may be coupled to the first lower chip pads 213 and the second lower chip pads 215. The second lower semiconductor chips 212 may be electrically connected through the first lower chip pads 213 to the substrate 100.

The upper semiconductor chips 220 may include a plurality of first upper semiconductor chips 221 and a plurality of second upper semiconductor chips 222. The first upper semiconductor chips 221 and the second upper semiconductor chips 222 may be stacked alternately with each other. The upper semiconductor chips 220 may have a stepwise stack structure. For example, a lowermost first upper semiconductor chip 221 may be shifted in the first direction D1 or its opposite direction from an uppermost lower semiconductor chip 210. The second upper semiconductor chips 222 may be shifted in the first direction D1 or its opposite direction from the first upper semiconductor chips 221. The second upper semiconductor chips 222 may expose top surfaces at the pad areas of the first upper semiconductor chips 221. The pad area of one of the first upper semiconductor chips 221 may be adjacent to the first lateral surface 101 of the substrate 100. For example, when viewed in plan, the pad area of one of the first upper semiconductor chips 221 may be provided between the first lateral surface 101 of the substrate 100 and the mount area of the one of the first upper semiconductor chip 221. The pad area of another of the first upper semiconductor chips 221 may be adjacent to the second lateral surface 102 of the substrate 100. For example, when viewed in plan, the pad area of another of the first upper semiconductor chips 221 may be provided between the second lateral surface 102 of the substrate 100 and the mount area of the another of the first upper semiconductor chip 221. Therefore, the first upper bonding wires BW1 coupled to different first upper semiconductor chips 221 may not vertically overlap each other. The second upper bonding wires BW2 coupled to different first upper semiconductor chips 221 may not vertically overlap each other. A second vertical interval H1" between a top surface of the lowermost first upper semiconductor chip 221 and the top surface of the substrate 100 may be equal to or greater than about 600 μm.

As illustrated in FIGS. 4A and 4B, the first upper bonding wires BW1 may have their first end portions BWh1 in direct contact with the first conductive chip pads 223A. The first upper bonding wires BW1 may have their second end portions BWs1 provided between the first substrate pads 111 and the fixing bumps 310.

The substrate 100 may have a plurality of first regions R1, a plurality of second regions R2, and a plurality of third regions R3. As illustrated in FIG. 4A, the first upper bonding wires BW1 and the second upper bonding wires BW2 may have their maximum vertical levels on the first regions R1 of the substrate 100. The first upper bonding wires BW1 and the second upper bonding wires BW2 may respectively have maximum points BW1a and maximum points BW2a that are the respective points of the respective maximum vertical levels of the first and second upper bonding wires BW1 and BW2 and that vertically overlap the first regions R1 of the substrate 100. On the first regions R1 of the substrate 100, the first upper bonding wires BW1 may be located at a vertical level higher than that of the second upper bonding wires BW2.

On the second regions R2 of the substrate 100, the second upper bonding wires BW2 may be located at a vertical level higher than that of the first upper bonding wires BW1 adjacent thereto. A vertical level difference B between the second upper bonding wires BW2 and their adjacent first upper bonding wires BW1 may be equal to or greater than about one times a diameter A1 of the first upper bonding wires BW1 and about one times a diameter A2 of the second upper bonding wires BW2. Therefore, the occurrence of electric short may be prevented between the first and second upper bonding wires BW1 and BW2, or at least the likelihood of the electric short occurrence may be reduced, thereby improving semiconductor package reliability and/or performance.

The number of the first lower semiconductor chips 211 and of the second lower semiconductor chips 212 may be variously changed without being limited to that shown. There may be a large variation in the number of stacked first upper semiconductor chips 221 and of stacked second upper semiconductor chips 222.

Figure 5A:
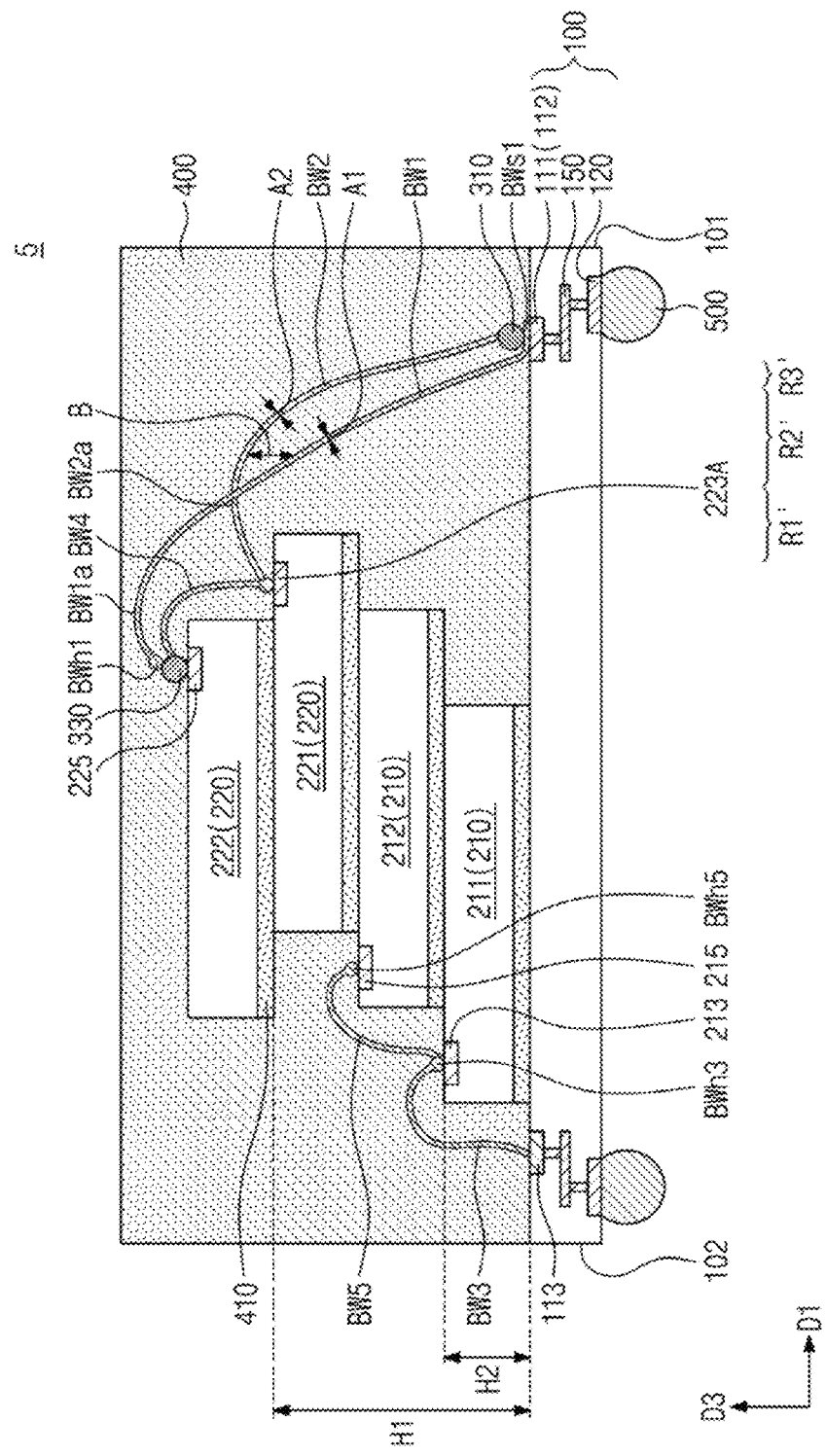
FIG. 5A illustrates a side view showing a semiconductor package according to some example embodiments.
Figure 5B:
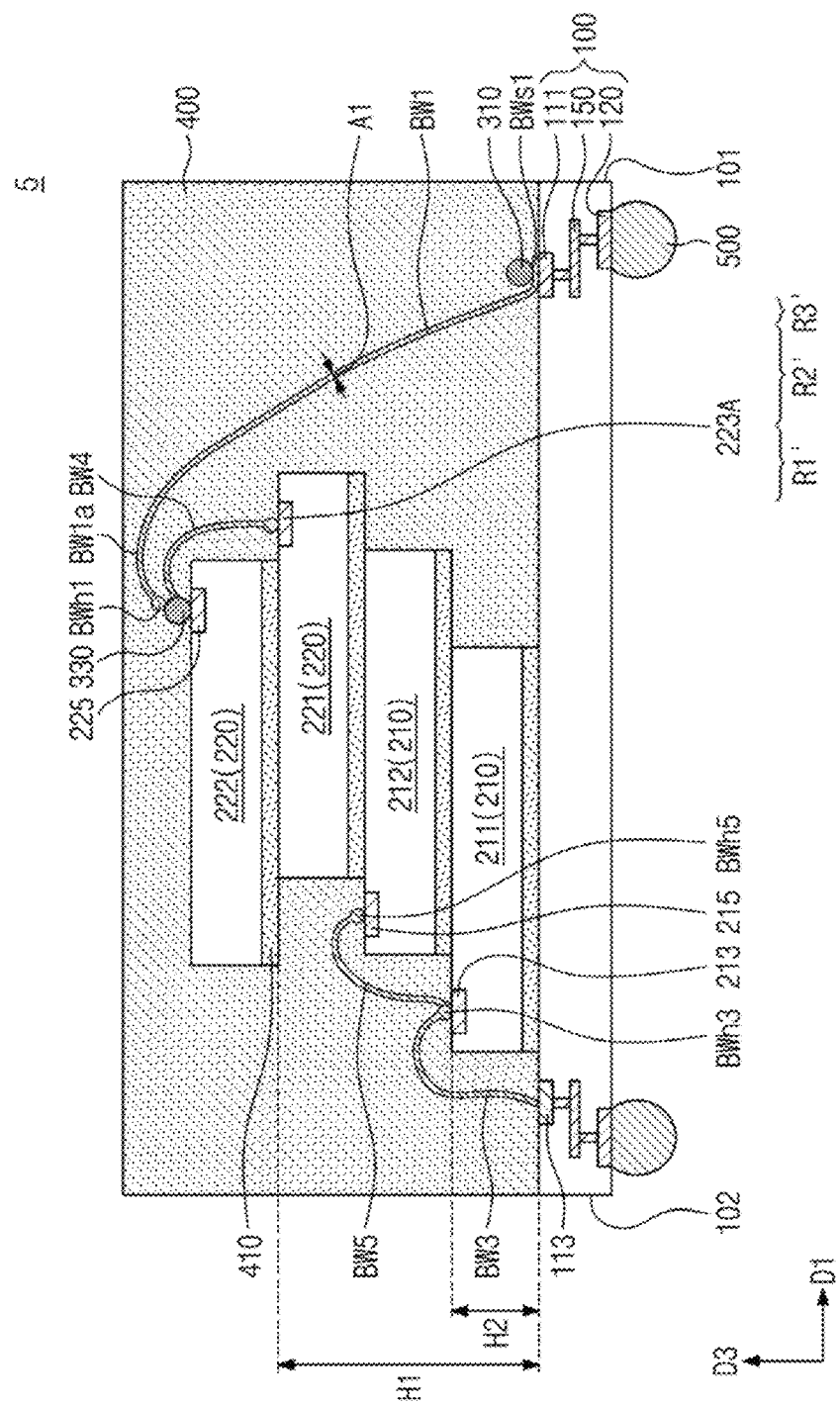
FIG. 5B illustrates a cross-sectional view taken along one line of the semiconductor package shown in FIG. 5A according to some example embodiments.
Figure 5C:
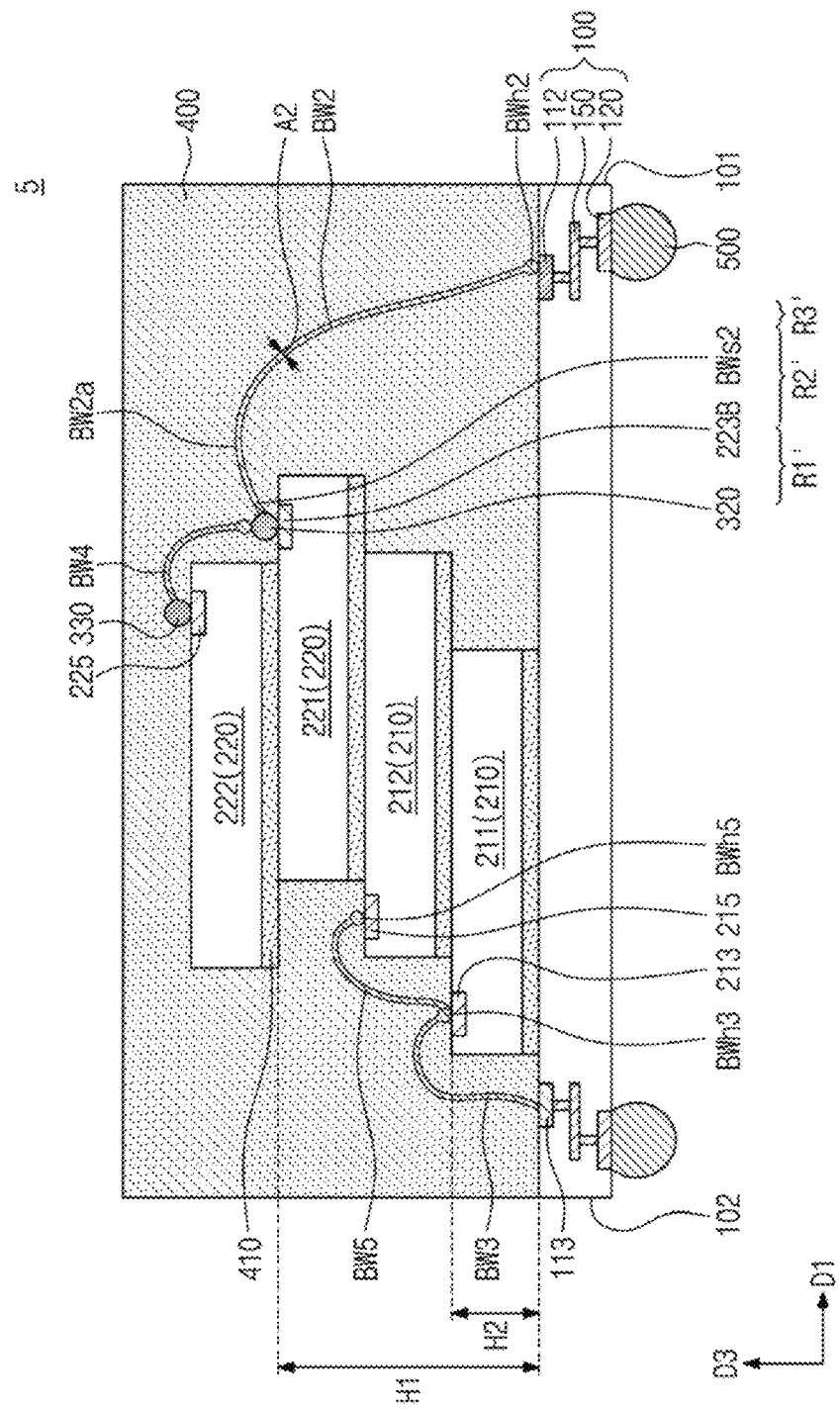
FIG. 5C illustrates a cross-sectional view taken along one line of the semiconductor package shown in FIG. 5A according to some example embodiments.

FIG. 5A illustrates a side view showing a semiconductor package according to some example embodiments. FIG. 5B illustrates a cross-sectional view taken along one line of the semiconductor package shown in FIG. 5A according to some example embodiments. FIG. 5C illustrates a cross-sectional view taken along one line of the semiconductor package shown in FIG. 5A according to some example embodiments. In explaining FIGS. 5A to 5C, the following will refer to FIG. 1A.

Referring to FIGS. 5A to 5C, a semiconductor package 5 may include a substrate 100, solder balls 500, a lower semiconductor chip 210, an upper semiconductor chip 220, a first lower bonding wire BW3, a second lower bonding wire BW5, a first upper bonding wire BW1, a second upper bonding wire BW2, a third upper bonding wire BW4, a stud bump 320, a fixing bump 310, and a molding layer 400.

The first upper bonding wire BW1 and the second upper bonding wire BW2 may be adjacent to each other. The second upper bonding wire BW2 may be substantially the same as that discussed in the examples of FIGS. 1A to 1D and 1F.

The first upper bonding wire BW1 may be provided on a top surface of the second upper semiconductor chip 222 and coupled to a corresponding upper chip pad 225. The first upper bonding wire BW1 may be formed by a forward loop process. The first end portion BWh1 of the first upper bonding wire BW1 may be in direct contact with a corresponding upper chip pad 225. The second end portion BWs1 of the first upper bonding wire BW1 may be in direct contact with the first substrate pad 111. The fixing bump 310 may be provided on the second end portion BWs1 of the first upper bonding wire BW1.

As discussed above, the substrate 100 may have a first region R1', a second region R2', and a third region R3'. The first region R1', the second region R2', and the third region R3' of the substrate 100 may be substantially the same respectively as the first region R1, the second region R2, and the third region R3 of the substrate 100 depicted in FIGS. 1A to 1D. For example, when viewed in plan, an interval between the first and second conductive chip pads 223A and 223B and one of the first, second, or third regions R1', R2', and R3' of the substrate 100 may not be limited to that discussed in the examples of FIGS. 1A to 1D.

As the first end portion BWh1 of the first upper bonding wire BW1 is provided on the upper chip pad 225, a large difference in vertical level may be provided between the first upper bonding wire BW1 and the second upper bonding wire BW2. Accordingly, an electric short may be effectively prevented between the first and second upper bonding wires BW1 and BW2, or at least the likelihood of the electric short occurrence may be reduced, thereby improving semiconductor package reliability and/or performance. For example, on the second region R2' of the substrate 100, a vertical level difference B between the second upper bonding wire BW2 and the first upper bonding wire BW1 may be equal to or greater than about one times a diameter A1 of the first upper bonding wire BW1 and equal to or greater than about one times a diameter A2 of the second upper bonding wire BW2.

The first upper bonding wire BW1 and the second upper bonding wire BW2 may respectively have a maximum point BW1a and a maximum point BW2a that vertically overlap the first region R1' of the substrate 100.

The third upper bonding wire BW4 may be provided on a top surface of the second upper semiconductor chip 222 and on a top surface of the first upper semiconductor chip 221. The third upper bonding wire BW4 may be similar to that discussed above in the examples of FIGS. 1A to 1D. The third upper bonding wire BW4 may be formed by a reverse loop process. For example, the step of allowing the third upper bonding wires BW4 to electrically connect to the first and second conductive chip pads 223A and 223B may be followed by the step of allowing the third upper bonding wires BW4 to electrically connect to the upper chip pads 225.

The third upper bonding wires BW4 may have their first end portions provided on the upper chip pads 225. The first end portions of the third upper bonding wires BW4 may be stitch portions.

The semiconductor package 5 may further include stud bump patterns 330. The stud bump patterns 330 may be provided between the upper chip pads 225 and the first end portions of the third upper bonding wires BW4. The third upper bonding wires BW4 may be coupled through the stud bump patterns 330 to the upper chip pads 225. The stud bump patterns 330 may include metal, such as gold (Au).

However, the stud bump patterns 330 may include metal different from that of the upper chip pads 225. The stud bump patterns 330 may each have a spherical shape or a circular shape.

The third upper bonding wires BW4 may have their second end portions provided on the first and second conductive chip pads 223A and 223B. The second end portions of the third upper bonding wires BW4 may be bonding balls. Each of the bonding balls may have a spherical shape or an oval shape. As illustrated in FIG. 5B, one of the second end portions of the third upper bonding wires BW4 may be in direct contact with the first conductive chip pad 223A without through a separate stud bump. As illustrated in FIG. 5C, another of the second end portions of the third upper bonding wires BW4 may be in contact with the stud bump 320. Differently from that shown, the stud bump 320 may be omitted, the another of the second end portions of the third upper bonding wires BW4 may be in direct contact with the second conductive chip pad 223B. In this case, the second end portion BWs2 of the second upper bonding wire BW2 may be bonded to the another of the second end portions of the third upper bonding wires BW4.

Figure 6A:
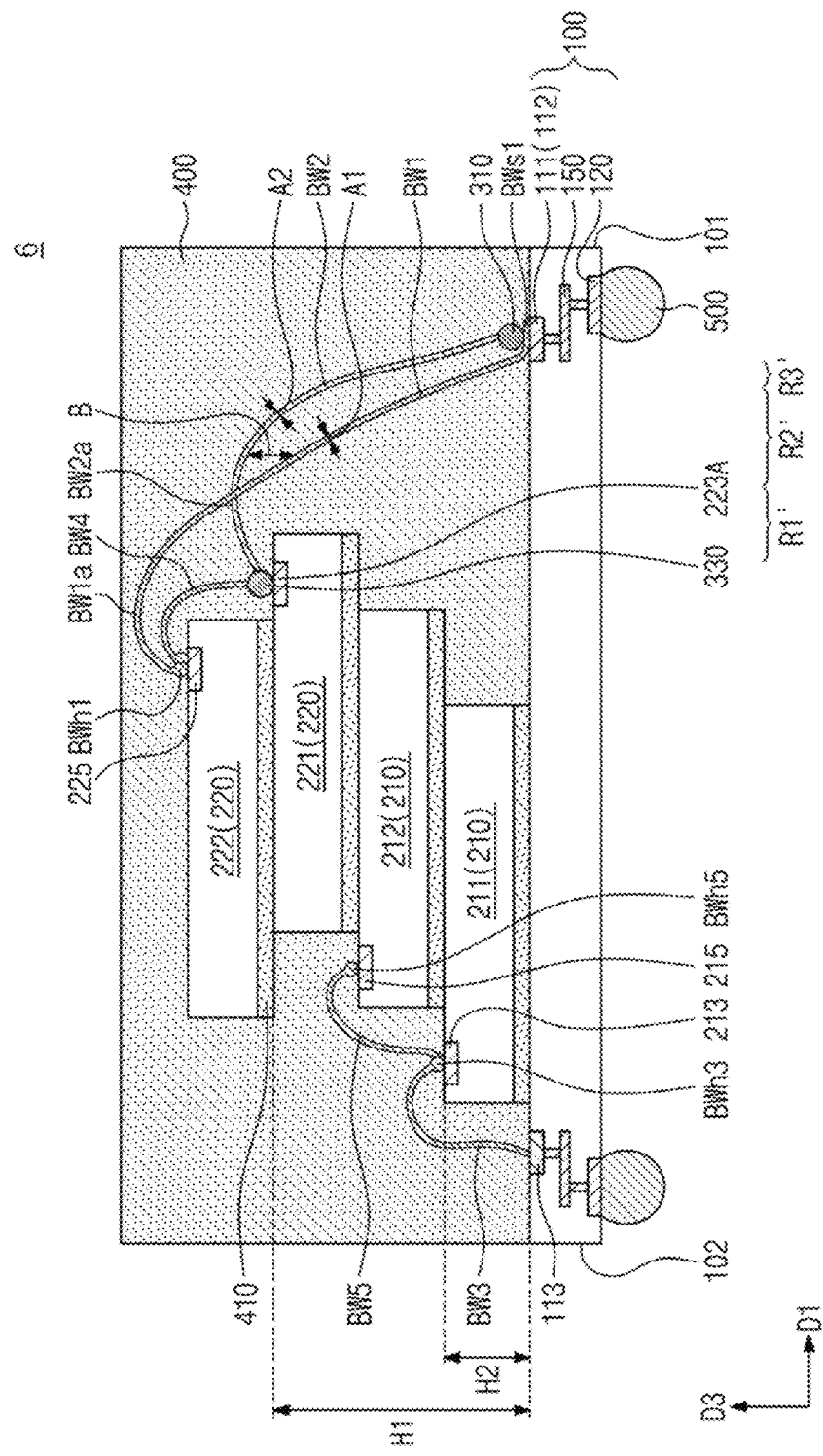
FIG. 6A illustrates a side view showing a semiconductor package according to some example embodiments.
Figure 6B:
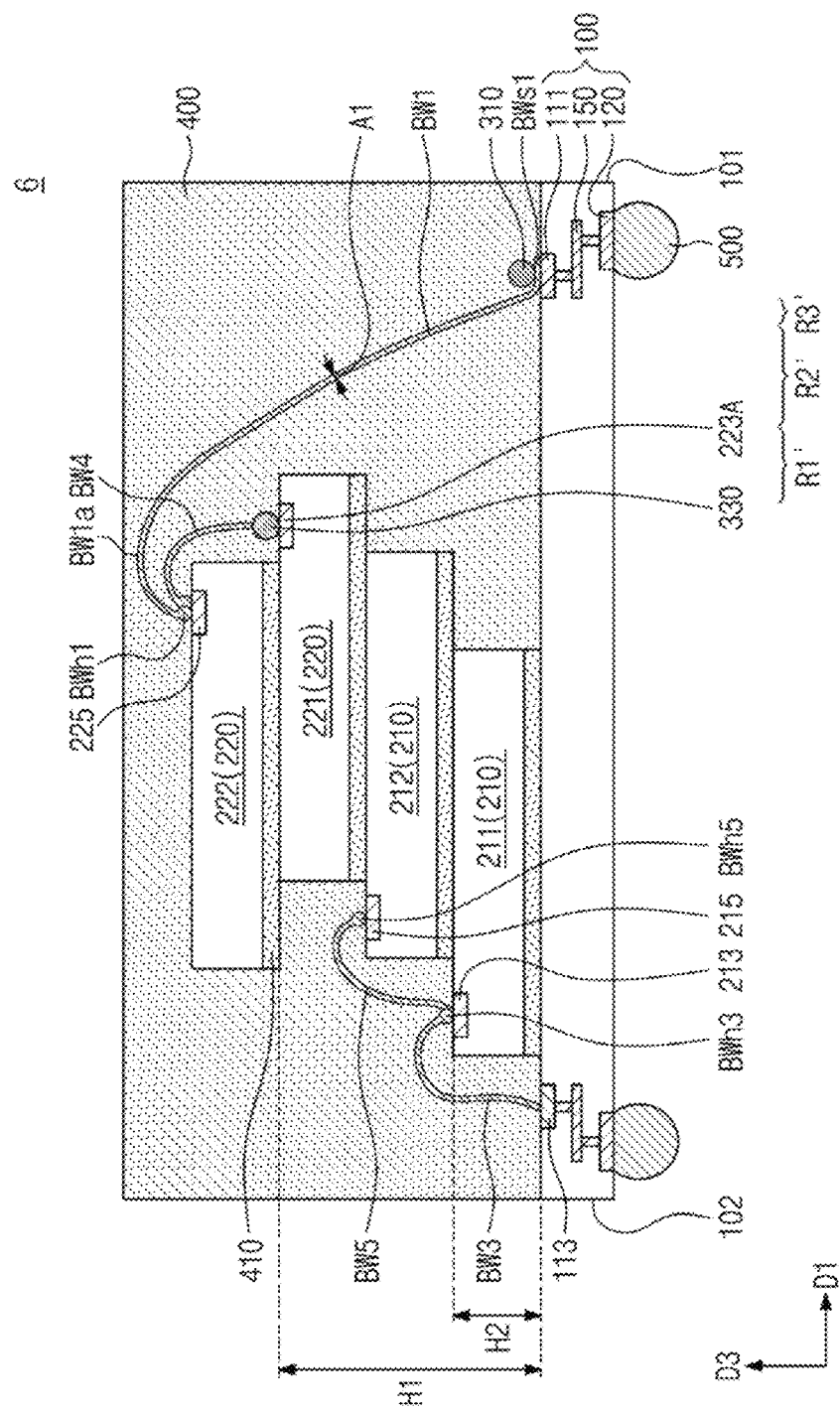
FIG. 6B illustrates a cross-sectional view taken along one line of the semiconductor package shown in FIG. 6A according to some example embodiments.
Figure 6C:
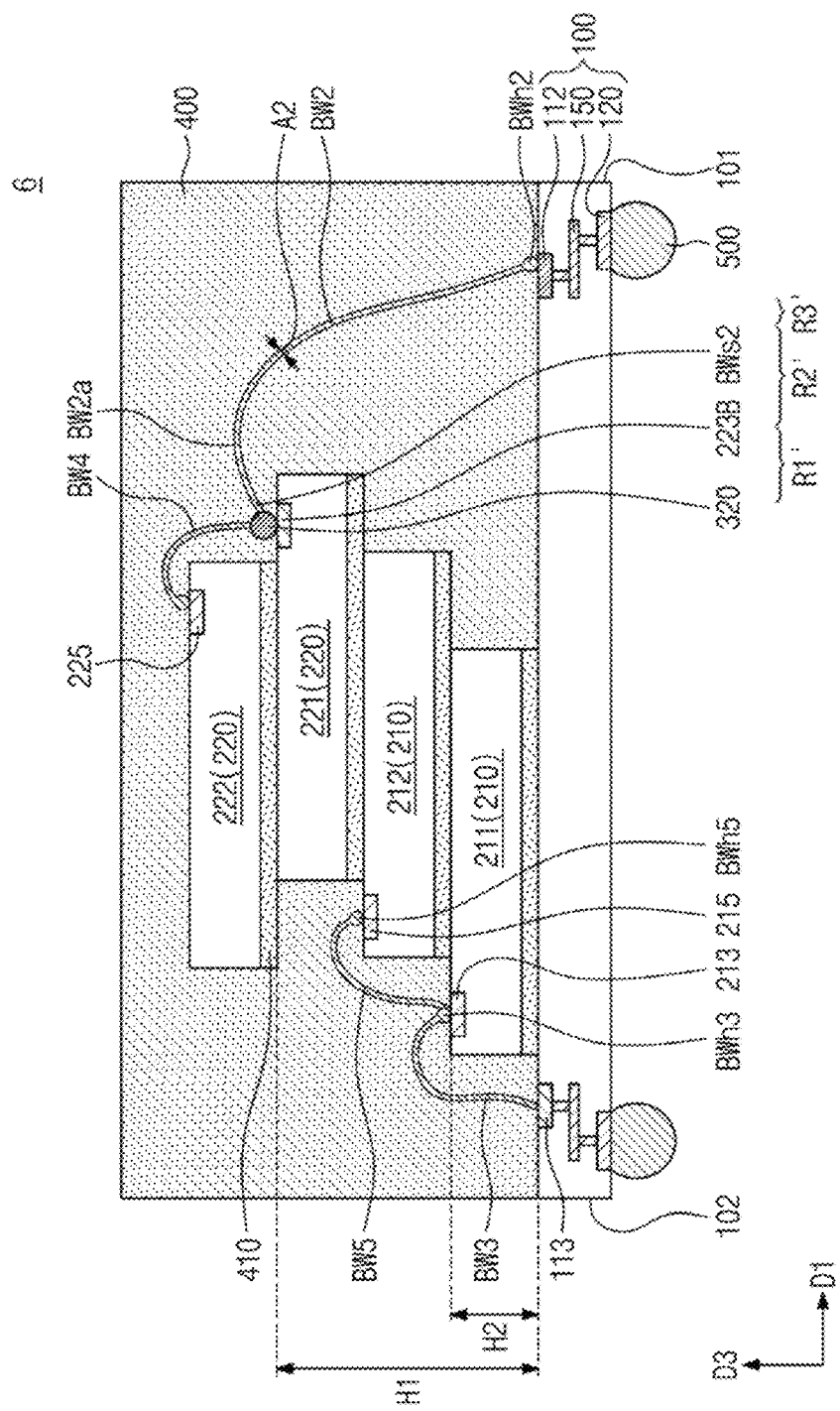
FIG. 6C illustrates a cross-sectional view taken along one line of the semiconductor package shown in FIG. 6A according to some example embodiments.

FIG. 6A illustrates a side view showing a semiconductor package according to some example embodiments. FIG. 6B illustrates a cross-sectional view taken along one line of the semiconductor package shown in FIG. 6A according to some example embodiments. FIG. 6C illustrates a cross-sectional view taken along one line of the semiconductor package shown in FIG. 6A according to some example embodiments. In explaining FIGS. 6A to 6C, the following will refer to FIG. 1A.

Referring to FIGS. 6A to 6C, a semiconductor package 6 may include a substrate 100, solder balls 500, a lower semiconductor chip 210, an upper semiconductor chip 220, a first lower bonding wire BW3, a second lower bonding wire BW5, a first upper bonding wire BW1, a second upper bonding wire BW2, a third upper bonding wire BW4, a stud bump 320, a stud bump pattern 330, a fixing bump 310, and a molding layer 400.

The first upper bonding wire BW1 and the second upper bonding wire BW2 may be adjacent to each other. The first upper bonding wire BW1 may be substantially the same as that discussed in the examples of FIGS. 5A to 5C.

The third upper bonding wire BW4 may be substantially the same as that discussed above in the examples of FIGS. 1A to 1D. For example, a forward loop process may be employed to form the third upper bonding wires BW4.

The third upper bonding wires BW4 may have their second end portions provided on the first and second conductive chip pads 223A and 223B. As illustrated in FIG. 6B, the stud bump pattern 330 may be provided between the first conductive chip pad 223A and the second end portion of one of the third upper bonding wires BW4. The one of the third upper bonding wires BW4 may be bonded through the stud bump pattern 330 to the first conductive chip pad 223A.

As illustrated in FIG. 6C, the second end portion of another of the third upper bonding wires BW4 may be electrically connected through the stud bump 320 to the second upper bonding wire BW2.

Figure 7A:
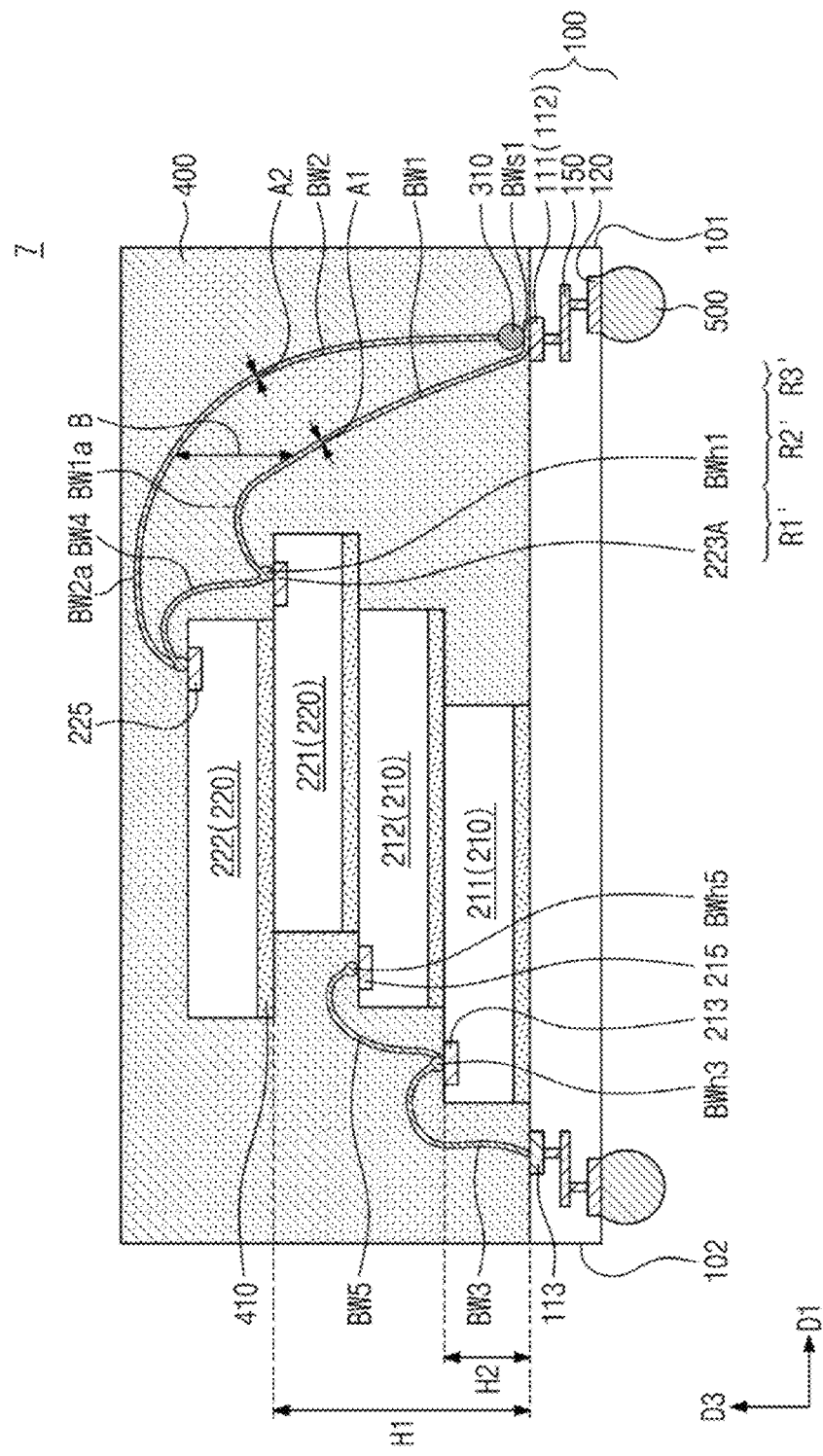
FIG. 7A illustrates a side view showing a semiconductor package according to some example embodiments.
Figure 7B:
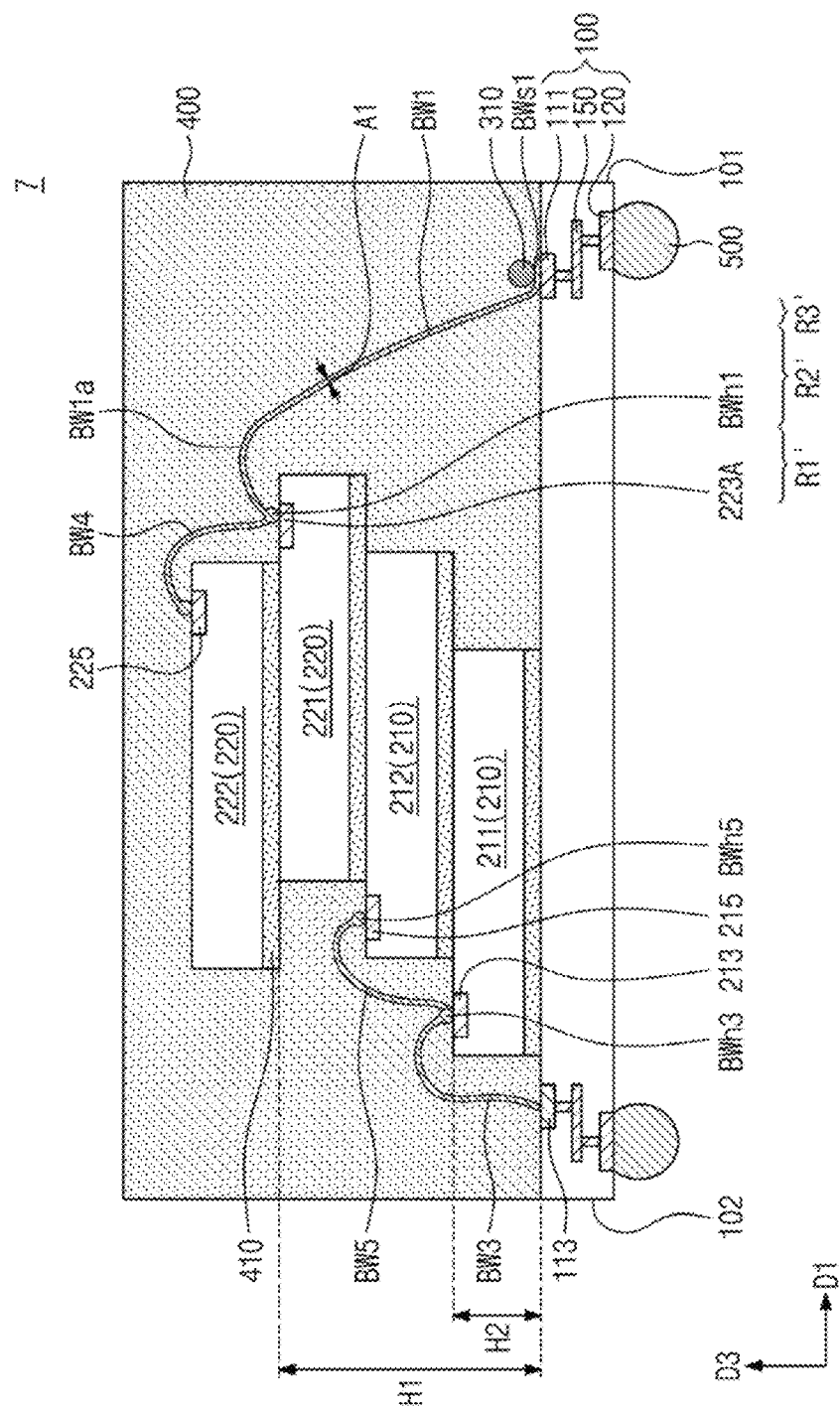
FIG. 7B illustrates a cross-sectional view taken along one line of the semiconductor package shown in FIG. 7A according to some example embodiments.
Figure 7C:
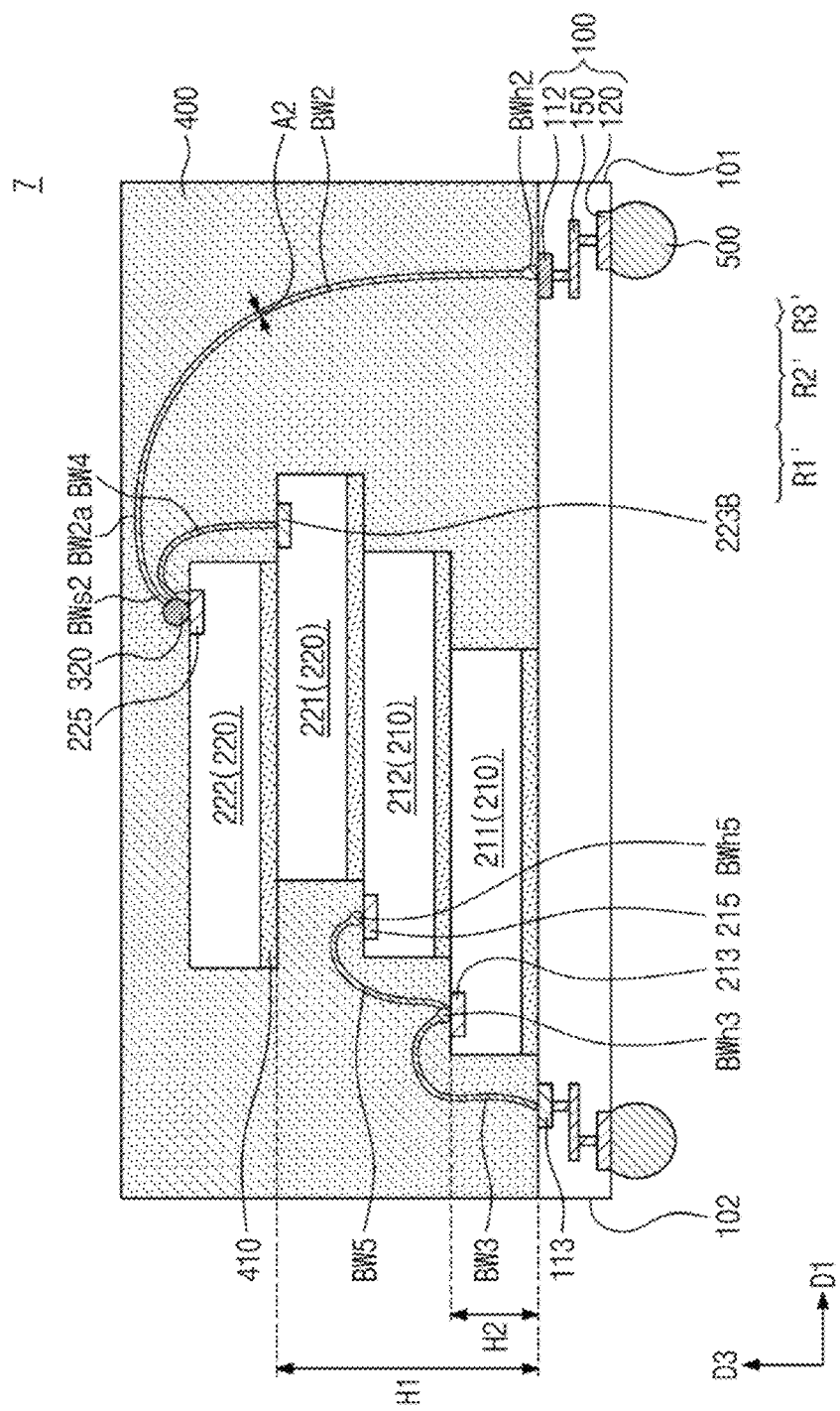
FIG. 7C illustrates a cross-sectional view taken along one line of the semiconductor package shown in FIG. 7A according to some example embodiments.

FIG. 7A illustrates a side view showing a semiconductor package according to some example embodiments. FIG. 7B illustrates a cross-sectional view taken along one line of the semiconductor package shown in FIG. 7A according to some example embodiments. FIG. 7C illustrates a cross-sectional view taken along one line of the semiconductor package shown in FIG. 7A according to some example embodiments. In explaining FIGS. 7A to 7C, the following will refer to FIG. 1A.

Referring to FIGS. 7A to 7C, a semiconductor package 7 may include a substrate 100, solder balls 500, a lower semiconductor chip 210, an upper semiconductor chip 220, a first lower bonding wire BW3, a second lower bonding wire BW5, a first upper bonding wire BW1, a second upper bonding wire BW2, a third upper bonding wire BW4, a stud bump 320, a fixing bump 310, and a molding layer 400.

The first upper bonding wire BW1 and the second upper bonding wire BW2 may be adjacent to each other. The first upper bonding wire BW1 may be substantially the same as that discussed in the examples of FIGS. 1A to 1D.

The second upper bonding wire BW2 may be provided on a top surface of the second upper semiconductor chip 222. A reverse loop process may be employed to form the second upper bonding wire BW2. As illustrated in FIG. 7C, the second end portion BWh2 of the second upper bonding wire BW2 may be provided on the second substrate pad 112. The stud bump 320 may be provided between the upper chip pad 225 and the first end portion BWs2 of the second upper bonding wire BW2. The first end portion BWs2 of the second upper bonding wire BW2 may be electrically connected through the stud bump 320 to the upper chip pad 225. The second end portion BWh2 of the second upper bonding wire BW2 may be in direct contact with the second substrate pad 112.

The first upper bonding wire BW1 and the second upper bonding wire BW2 may respectively have a maximum point BW1$a$ and a maximum point BW2$a$ that vertically overlap the first region R1' of the substrate 100.

As the first end portion BWs2 of the second upper bonding wire BW2 is provided on the upper chip pad 225, as illustrated in FIG. 7A, a large difference in vertical level may be provided between the first upper bonding wire BW1 and the second upper bonding wire BW2. An electric short may be effectively prevented between the first and second upper bonding wires BW1 and BW2, or at least the likelihood of the electric short occurrence may be reduced, thereby improving semiconductor package reliability and/or performance. For example, on the second region R2' of the substrate 100, a vertical level difference B between the second upper bonding wire BW2 and the first upper bonding wire BW1 may be equal to or greater than about one times a diameter A1 of the first upper bonding wire BW1 and equal or greater than about one times a diameter A2 of the second upper bonding wire BW2.

The third upper bonding wires BW4 may be provided on a top surface of the second upper semiconductor chip 222 and on a top surface of the first upper semiconductor chip 221. The third upper bonding wire BW4 may be substantially the same as that discussed above in the examples of FIGS. 1A to 1D. For example, a forward loop process may be employed to form the third upper bonding wires BW4. As illustrated in FIG. 7C, the first end portion of one of the third upper bonding wires BW4 may be bonded to the stud bump 320.

In some example embodiments, the third upper bonding wire BW4 may be formed by a reverse loop process. In this case, there may be further provided a stud bump pattern 330 discussed in the example of FIGS. 5A to 5C or in the example of FIGS. 6A to 6C.

According to the present inventive concepts, on first and second regions of a substrate, first upper bonding wires and second upper bonding wires may be provided at vertical levels different from each other. Accordingly, an electric short may be prevented between the first and second upper bonding wires, or at least the likelihood of the electric short occurrence may be reduced, thereby improving semiconductor package reliability and/or performance.

This detailed description of the present inventive concepts should not be construed as limited to the example embodiments set forth herein, and it is intended that the present inventive concepts cover the various combinations, the modifications and variations of the inventive concepts without departing from the spirit and scope of the present inventive concepts.

What is claimed is:

1. A semiconductor package, comprising:
a substrate that includes a plurality of substrate pads on a top surface of the substrate;
a first upper semiconductor chip on the substrate and including a plurality of conductive chip pads; and
a plurality of bonding wires coupled to the substrate pads and the first upper semiconductor chip,
wherein the bonding wires include a first bonding wire and a second bonding wire that are adjacent to each other,
wherein, when viewed in plan, the substrate has
a first region between the conductive chip pads and the substrate pads; and
a second region between the first region and the substrate pads,
wherein the first and second bonding wires define a boundary between the first and second regions as a horizontal distance from the plurality of conductive chip pads at which the first and second bonding wires have a same vertical level on the substrate,
wherein the second bonding wire has a maximum vertical level on the first region of the substrate,
wherein, on the first region of the substrate, the first bonding wire is at a level higher than a level of the second bonding wire, and
wherein, on the second region of the substrate, the second bonding wire is at a level higher than a level of the first bonding wire.

2. The semiconductor package of claim 1, wherein a vertical level difference between the first bonding wire and the second bonding wire on the second region of the substrate is equal to or greater than a diameter of the first bonding wire on the second region of the substrate.

3. The semiconductor package of claim 1, further comprising a stud bump between the first upper semiconductor chip and the second bonding wire,
wherein the conductive chip pads include a first conductive chip pad and a second conductive chip pad,
wherein the first bonding wire is in direct contact with the first conductive chip pad, and
wherein the second bonding wire is electrically connected through the stud bump to the second conductive chip pad.

4. The semiconductor package of claim 1, further comprising a fixing bump on a first substrate pad of the plurality of substrate pads,
wherein the first bonding wire is between the first substrate pad and the fixing bump.

5. The semiconductor package of claim 1, further comprising:
a lower semiconductor chip between the substrate and the first upper semiconductor chip, the lower semiconductor chip including a plurality of lower chip pads on a top surface of the lower semiconductor chip; and a plurality of lower bonding wires coupled to the substrate and the lower chip pads,
wherein, on the second region of the substrate, a vertical level difference between the lower bonding wires is less than a vertical level difference between the first bonding wire and the second bonding wire.

6. The semiconductor package of claim 5, wherein
when viewed in plan, the first upper semiconductor chip is shifted in a first direction from the lower semiconductor chip, the first direction being parallel to the top surface of the substrate,
when viewed in plan, the first upper semiconductor chip has an overhang area spaced apart from the lower semiconductor chip, and
the first upper semiconductor chip exposes the lower chip pads.

7. The semiconductor package of claim 1, further comprising:
a second upper semiconductor chip on the first upper semiconductor chip and having a plurality of upper chip pads; and
a plurality of third bonding wires coupled to the upper chip pads and the conductive chip pads.

8. The semiconductor package of claim 7, wherein a vertical level difference between the plurality of third bonding wires is less than a vertical level difference between the first bonding wire and the second bonding wire on the second region of the substrate.

9. The semiconductor package of claim 1, wherein
the conductive chip pads are spaced apart from the substrate pads at a first horizontal interval when viewed in plan,
the first region of the substrate is spaced apart from the conductive chip pads at a distance greater than about 0% of the first horizontal interval and equal to or less than about 30% of the first horizontal interval, and
the second region of the substrate is spaced apart from the conductive chip pads at a distance greater than about 30% of the first horizontal interval and equal to or less than about 80% of the first horizontal interval.

10. A semiconductor package, comprising:
a substrate including a first substrate pad and a second substrate pad on a top surface of the substrate;
an upper semiconductor chip on the substrate and including a plurality of conductive chip pads on a top surface of the upper semiconductor chip, the conductive chip pads including a first conductive chip pad and a second conductive chip pad that are adjacent to each other;
a first upper bonding wire coupled to the first conductive chip pad and the first substrate pad;
a second upper bonding wire coupled to the second conductive chip pad and the second substrate pad;
a stud bump between the second conductive chip pad and the second upper bonding wire; and
a fixing bump on an end portion of the first upper bonding wire,
wherein the end portion of the first upper bonding wire is between the first substrate pad and the fixing bump, and
wherein the first upper bonding wire is in direct contact with the first conductive chip pad.

11. The semiconductor package of claim 10, wherein the stud bump includes a metal that is different from a metal of the first conductive chip pad.

12. The semiconductor package of claim 10, further comprising a molding layer on the substrate and covering the upper semiconductor chip,
wherein an end portion of the second upper bonding wire is coupled to the second substrate pad, and
wherein the end portion of the second upper bonding wire is covered with the molding layer.

13. The semiconductor package of claim 10, further comprising:
a lower semiconductor chip between the substrate and the upper semiconductor chip, the lower semiconductor chip including a plurality of lower chip pads on a top surface of the lower semiconductor chip; and
a plurality of lower bonding wires coupled to the substrate and the lower chip pads,
wherein the lower bonding wires are in direct contact with the lower chip pads.

14. The semiconductor package of claim 13, wherein the substrate has:
a first region between the conductive chip pads and the first and second substrate pads; and
a second region between the first region and the first and second substrate pads,
wherein a vertical level difference between the lower bonding wires is less than a vertical level difference between the first upper bonding wire and the second upper bonding wire on the second region of the substrate.

15. The semiconductor package of claim 10, wherein, when viewed in plan, the substrate has:
a first region between the conductive chip pads and the first and second substrate pads; and
a second region between the first region and the first and second substrate pads,
wherein, on the first region of the substrate, the first upper bonding wire is at a level higher than a level of the second upper bonding wire, and
wherein, on the second region of the substrate, the second upper bonding wire is at a level higher than a level of the first upper bonding wire.

16. A semiconductor package, comprising:
a substrate including a first substrate pad, a second substrate pad, and a plurality of third substrate pads, the first substrate pad, the second substrate pad, and the plurality of third substrate pads being on a top surface of the substrate;
a plurality of solder balls on a bottom surface of the substrate;
a lower semiconductor chip on the top surface of the substrate;
a first upper semiconductor chip on a top surface of the lower semiconductor chip and including a plurality of conductive chip pads, the conductive chip pads including a first conductive chip pad and a second conductive chip pad that are adjacent to each other;
a plurality of lower bonding wires coupled to the lower semiconductor chip and the third substrate pads, the lower bonding wires being adjacent to each other;
a first upper bonding wire coupled to the first conductive chip pad and the first substrate pad;
a second upper bonding wire coupled to the second conductive chip pad and the second substrate pad; and
a molding layer on the top surface of the substrate, the molding layer covering the lower semiconductor chip, the first upper semiconductor chip, the lower bonding wires, the first upper bonding wire, and the second upper bonding wire, wherein, when viewed in plan, the substrate has
  a first region between the first conductive chip pad and the first substrate pad and between the second conductive chip pad and the second substrate pad; and
  a second region between the first region and the first and second substrate pads,
wherein the first and second bonding wires define a boundary between the first and second regions as a horizontal distance from the plurality of conductive chip pads at which the first and second bonding wires have a same vertical level on the substrate,
wherein, on the first region of the substrate, the first upper bonding wire is at a level higher than a level of the second upper bonding wire,
wherein, on the second region of the substrate, the second upper bonding wire is at a level higher than a level of the first upper bonding wire, and
wherein, on the second region of the substrate, a vertical level difference between the lower bonding wires is less than a vertical level difference between the first upper bonding wire and the second upper bonding wire.

17. The semiconductor package of claim 16, wherein
the first upper bonding wire has a maximum vertical level on the first region of the substrate, and
the second upper bonding wire has a maximum vertical level on the first region of the substrate.

18. The semiconductor package of claim 16, further comprising:
  a second upper semiconductor chip on the first upper semiconductor chip and having a plurality of upper chip pads on a top surface of the second upper semiconductor chip; and
  a plurality of third upper bonding wires coupled to the upper chip pads and the conductive chip pads.

19. The semiconductor package of claim 18, wherein a vertical level difference between the plurality of third upper bonding wires on the second region of the substrate is less than the vertical level difference between the first upper bonding wire and the second upper bonding wire on the second region of the substrate.

20. The semiconductor package of claim 16, wherein
on the second region of the substrate, the vertical level difference between the first upper bonding wire and the second upper bonding wire is equal to or greater than a diameter of the first upper bonding wire, and
on the second region of the substrate, the vertical level difference between the first upper bonding wire and the second upper bonding wire is equal to or greater than a diameter of the second upper bonding wire.

* * * * *